US012757440B2

(12) United States Patent
Lin et al.

(10) Patent No.: US 12,757,440 B2
(45) Date of Patent: Oct. 6, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Wen-Chiang Hong, Taipei City (TW); Chih-Hao Chang, Chu-Bei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 722 days.

(21) Appl. No.: 18/180,589

(22) Filed: Mar. 8, 2023

(65) Prior Publication Data

US 2024/0162310 A1 May 16, 2024

Related U.S. Application Data

(60) Provisional application No. 63/425,046, filed on Nov. 14, 2022.

(51) Int. Cl.

| | |
|---|---|
| ***H01L 29/417*** | (2006.01) |
| ***H01L 21/8234*** | (2006.01) |
| ***H01L 27/088*** | (2006.01) |
| ***H01L 29/06*** | (2006.01) |
| ***H01L 29/423*** | (2006.01) |

(Continued)

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/013* (2025.01); *H10D 84/0151* (2025.01); *H10D 84/038* (2025.01); *H10D 84/83* (2025.01)

(58) Field of Classification Search

CPC .... H10D 30/014; H10D 30/024; H10D 30/43; H10D 30/62; H10D 30/6211; H10D 30/6212; H10D 30/6213; H10D 30/6735; H10D 30/6757; H10D 62/118; H10D 62/119; H10D 62/121; H10D 64/017; H10D 84/038; H10D 84/0151; H10D 84/0158; H10D 84/0193; H10D 84/83; H10D 84/834; H10D 84/853

See application file for complete search history.

(56) References Cited

U.S. PATENT DOCUMENTS 9,209,247 B2 12/2015 Colinge et al.
9,236,267 B2 1/2016 De et al.

(Continued)

*Primary Examiner* — David C Spalla

(74) *Attorney, Agent, or Firm* — Birch, Stewart, Kolasch & Birch, LLP

(57) ABSTRACT

Semiconductor structures and methods for manufacturing the same are provided. The semiconductor structure includes a gate structure formed over a substrate, and a first source/drain (S/D) structure formed adjacent to the gate structure. The semiconductor structure includes a first contact structure formed over a first side of the first S/D structure, and a portion of the first contact structure is lower than a top surface of the first S/D structure. The semiconductor structure includes a second contact structure formed over a second side of the first S/D structure, and the second contact structure is in direct contact with the first contact structure.

20 Claims, 48 Drawing Sheets

(51) Int. Cl.

| | |
|---|---|
| ***H01L 29/66*** | (2006.01) |
| ***H01L 29/775*** | (2006.01) |
| ***H01L 29/786*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2022/0102522 | A1* | 3/2022 | Dewey | H10D 30/6219 |
| 2023/0420359 | A1* | 12/2023 | Xie | H10D 84/017 |
| 2024/0153990 | A1* | 5/2024 | Park | H10D 62/121 |

* cited by examiner

SEMICONDUCTOR STRUCTURE AND METHOD FOR FORMING THE SAME

CROSS REFERENCE TO RELATED APPLICATIONS

This Application claims the benefit of U.S. Provisional Application No. 63/425,046, filed on Nov. 14, 2022, and the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2 to 2O-2 illustrate cross-sectional representations of various stages of manufacturing the semiconductor structure shown along line B-B' in FIG. 1E, in accordance with some embodiments.

FIGS. 2A-3 to 2O-3 illustrate cross-sectional representations of various stages of manufacturing the semiconductor structure shown along line B-B' in FIG. 1E, in accordance with some embodiments FIG. 2O'-1 illustrates a cross-sectional view of a semiconductor structure, in accordance with some embodiments.

FIG. 3 illustrates a top view of the semiconductor structure, in accordance with some embodiments.

DETAILED DESCRIPTION

Figure 1A:
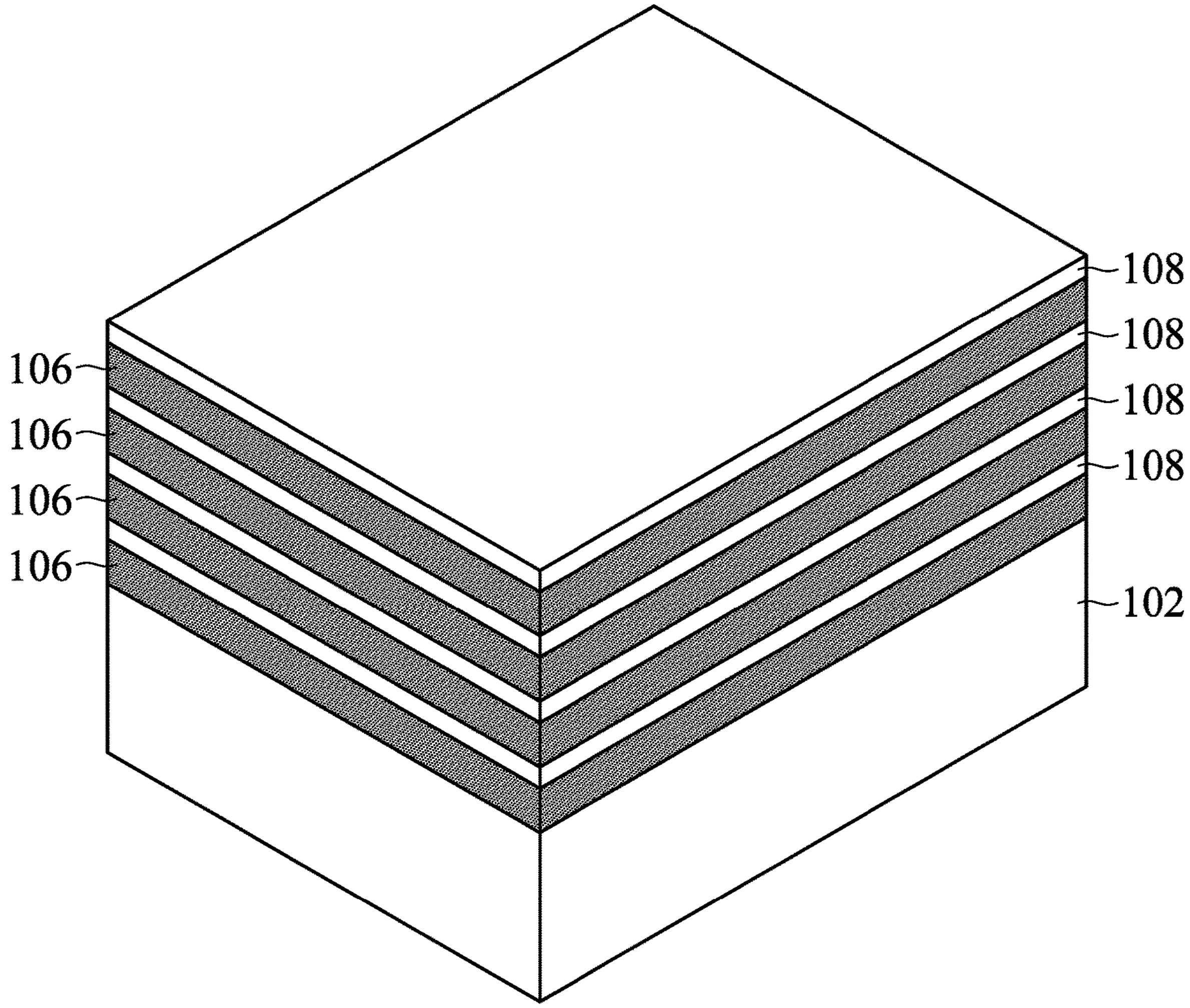
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a number of nanostructures formed over a substrate. A gate structure formed over the nanostructures and an S/D structure adjacent to the gate structure. A first contact structure formed over a first side (top side) of the S/D structure, and a second contact structure formed over a second side (bottom side) of the S/D structure. The first contact structure has an extending portion which is lower than the top surface of the S/D structure. In addition, the extending portion which is lower than the top surface of the topmost nanostructure. The extending portion of the first contact structure is physically and electrically connected to the second contact structure. Since the first contact structure is in direct contact with the second contact structure, no other layers are between them. The contact resistance is reduced. Therefore, the performance of the semiconductor structure is improved. The source/drain(S/D) structure or region(s) may refer to a source or a drain, individually or collectively dependent upon the context.

FIGS. 1A to 1E illustrate perspective views of intermediate stages of manufacturing a semiconductor structure 100*a* in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
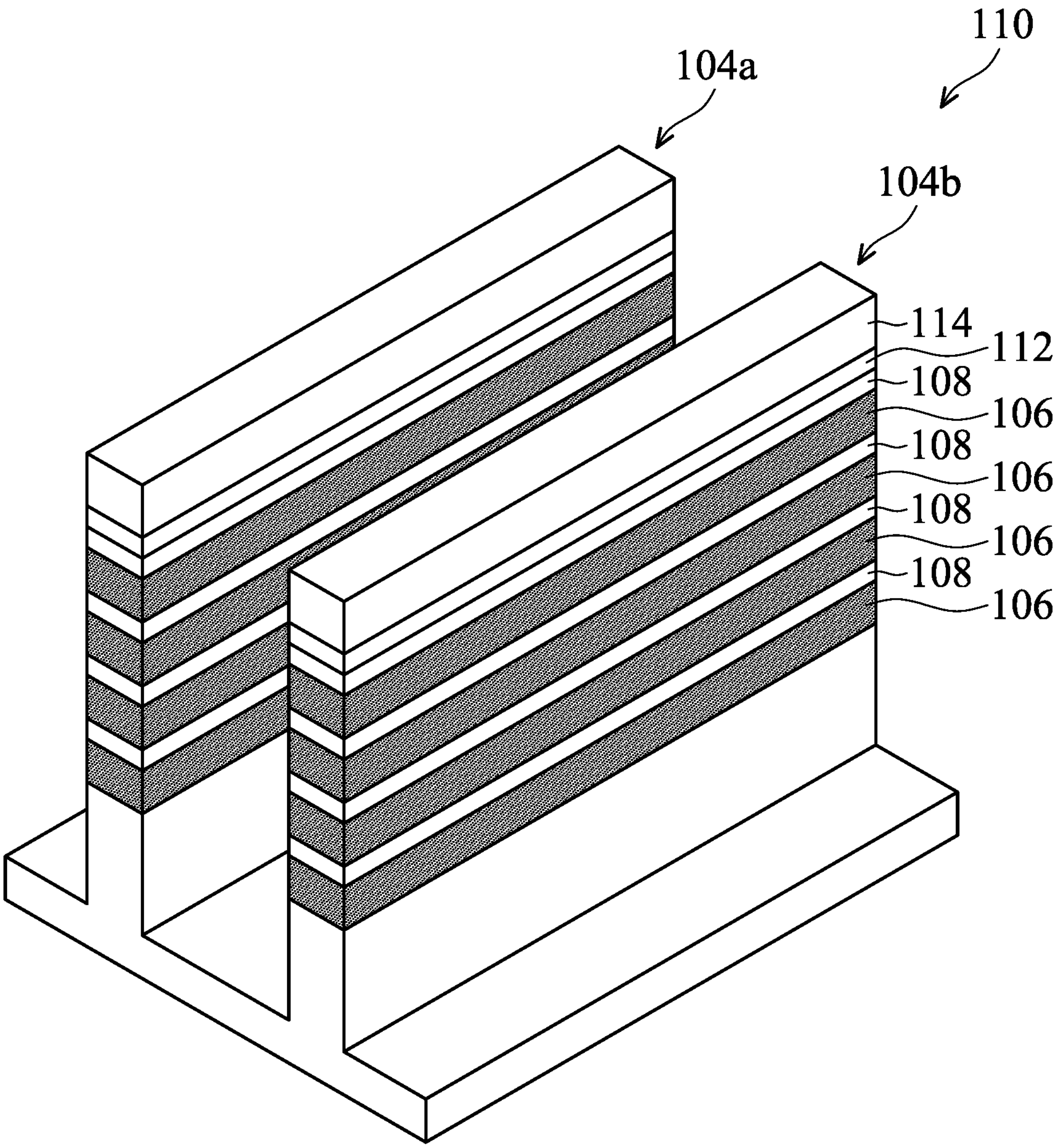

Afterwards, as shown in FIG. 1B, after the first semiconductor material layers 106 and the second semiconductor material layers 108 are formed as a semiconductor material stack over the substrate 102, the semiconductor material stack is patterned to form a first stack structure 104*a* and a second stack structure 104*b*, in accordance with some embodiments. In some embodiments, each of the first stack structure 104*a* and a second stack structure 104*b* includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
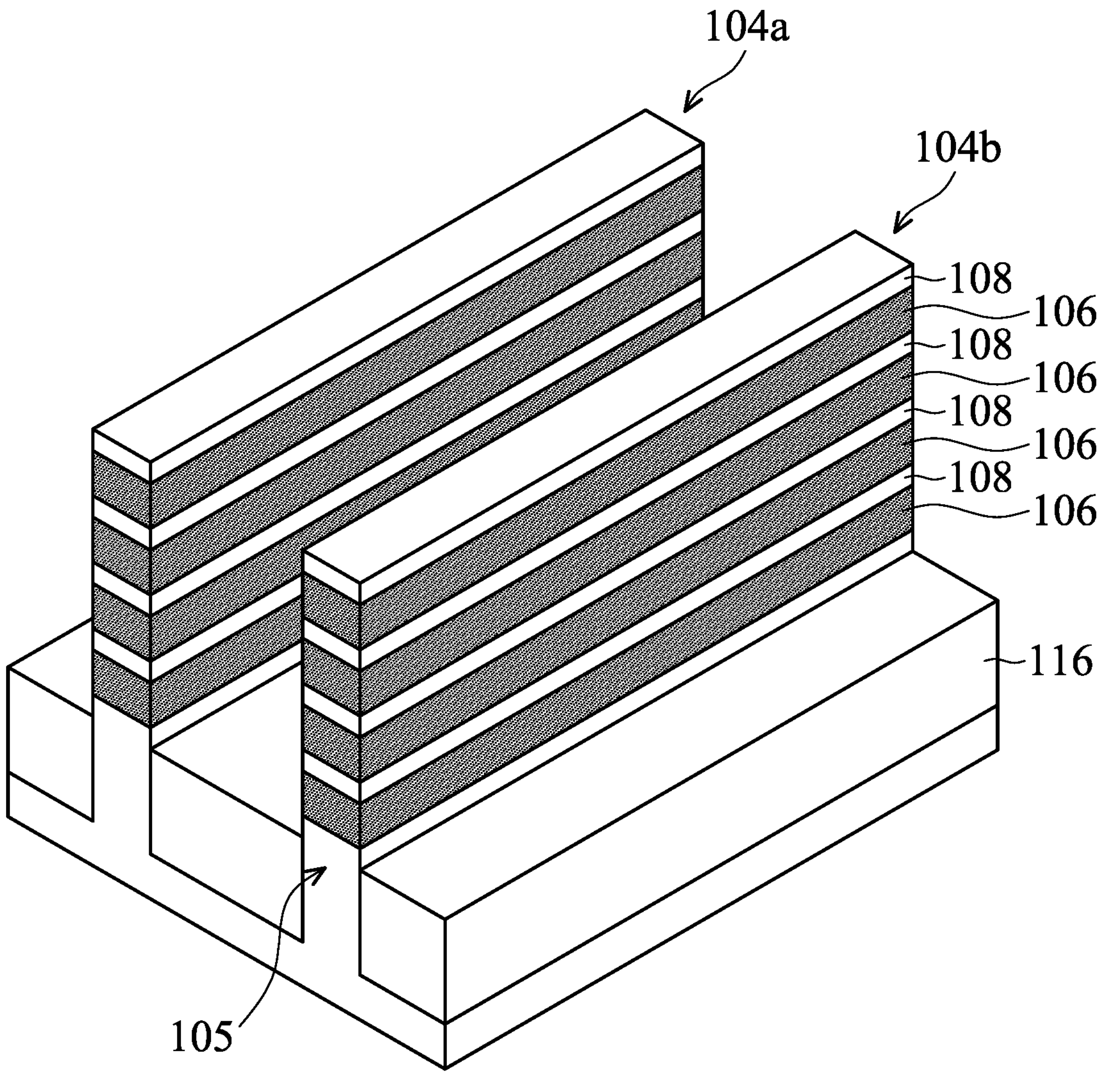

Next, as shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
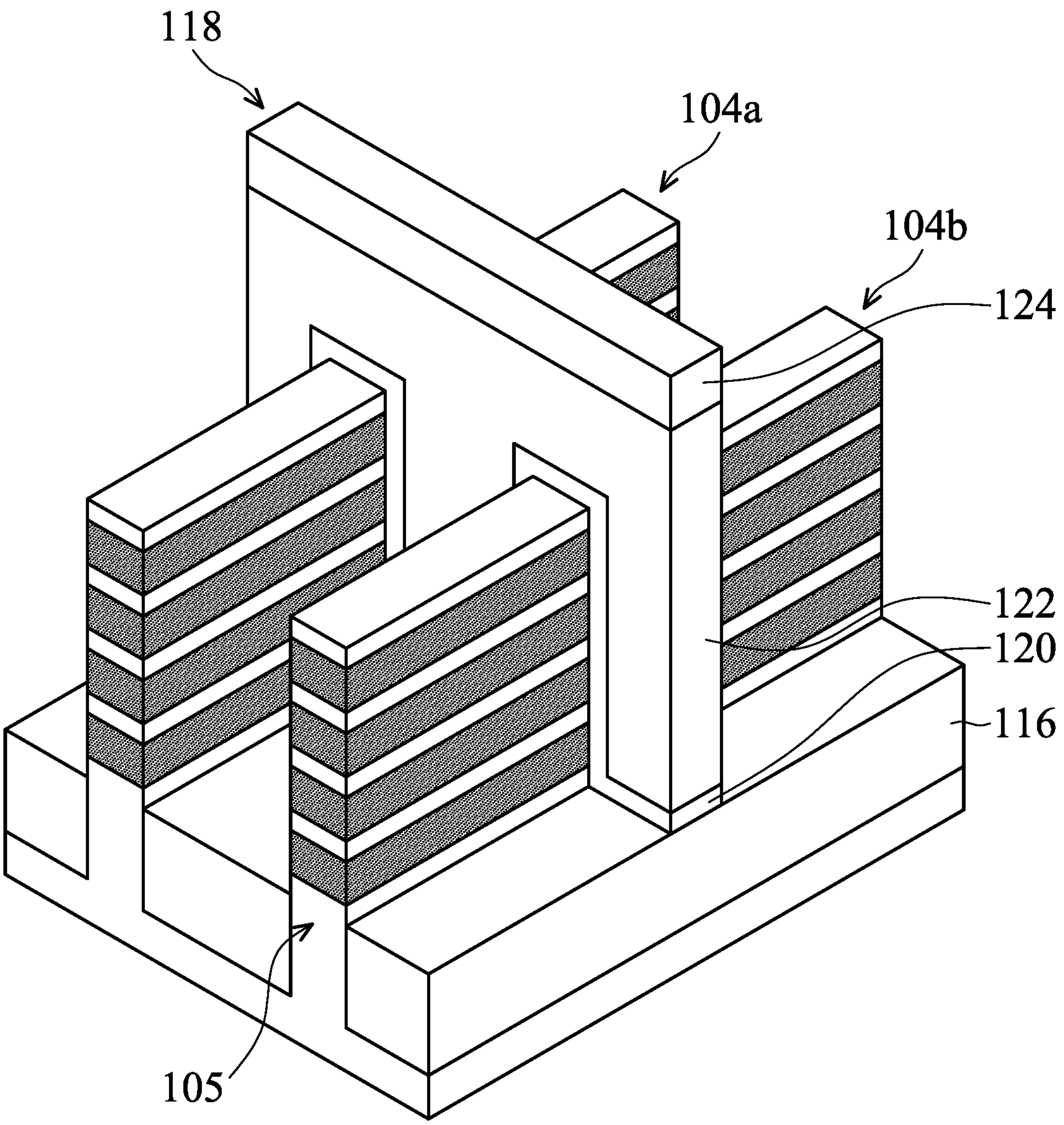

Afterwards, as shown in FIG. 1D, after the isolation structure 116 is formed, dummy gate structures 118 are formed across the fin structure 104 and extend over the isolation structure 116, in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
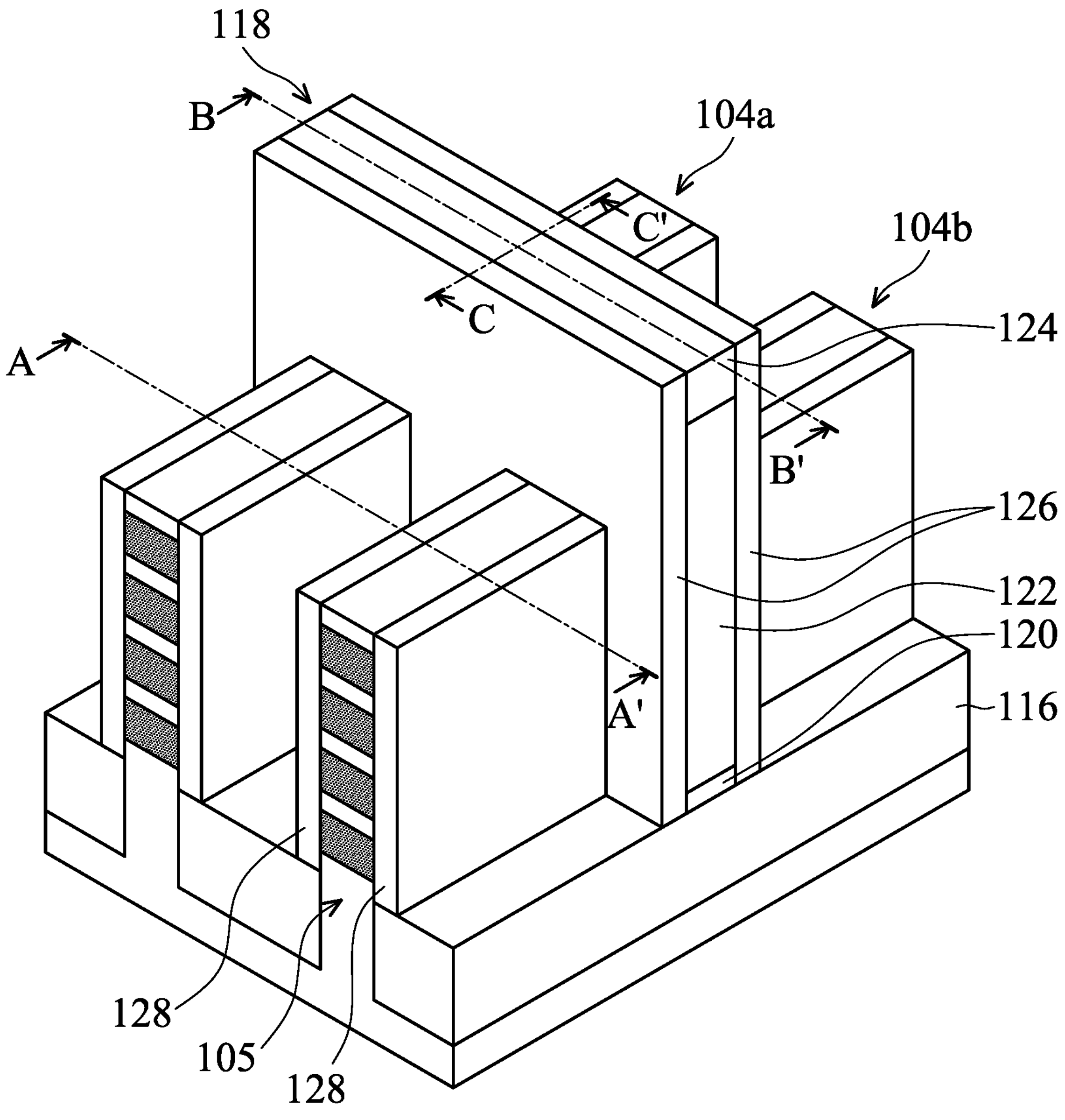

Next, as shown in FIG. 1E, after the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figures 1, 2A:
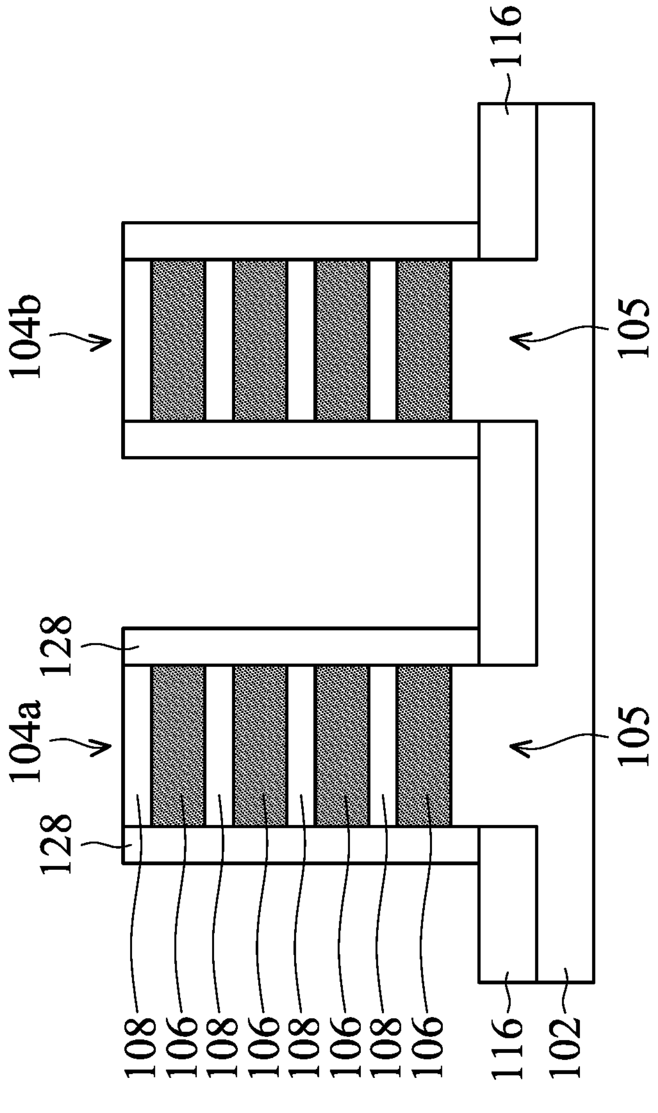
FIGS. 2A-1 to 2O-1 illustrate cross-sectional representations of various stages of manufacturing the semiconductor structure shown along line A-A' in FIG. 1E, in accordance with some embodiments.
Figures 2, 2A, 3:
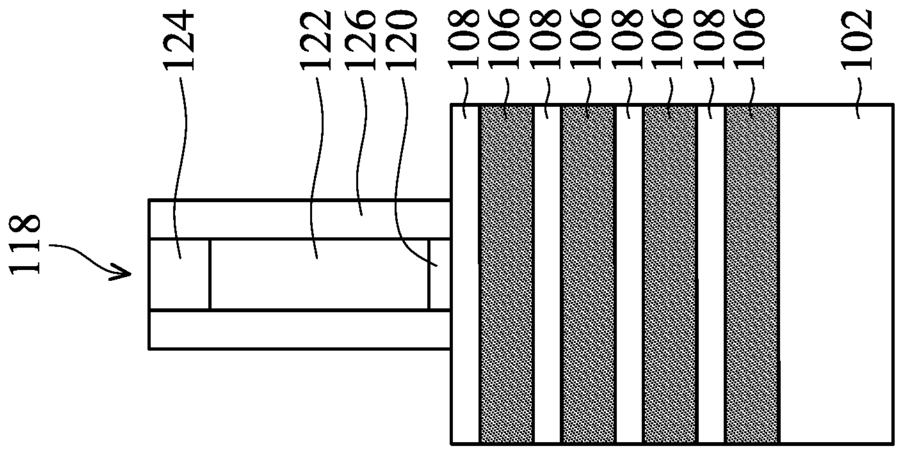
Figures 2, 2A:
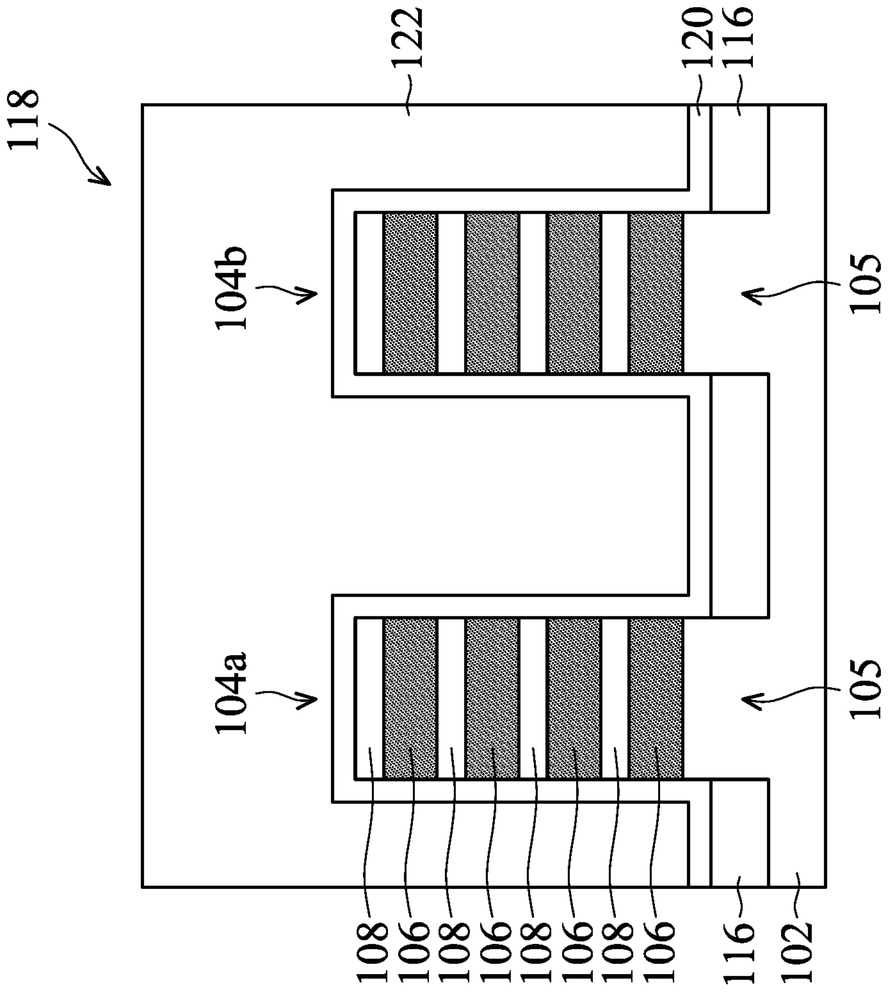
Figures 1, 2B:
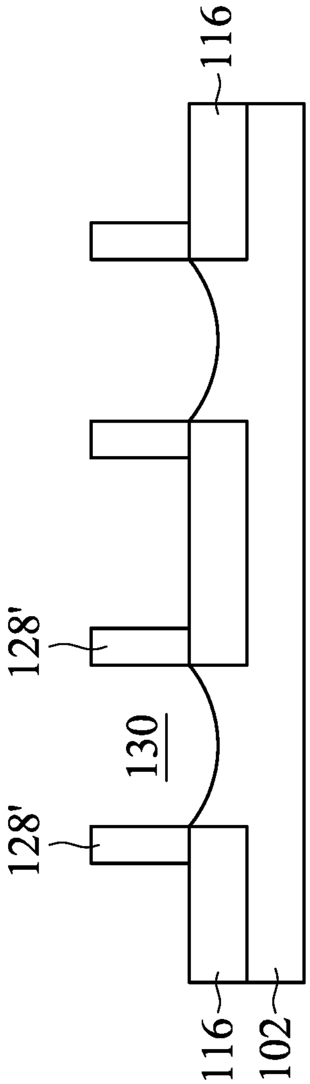
Figures 2, 2B, 3:
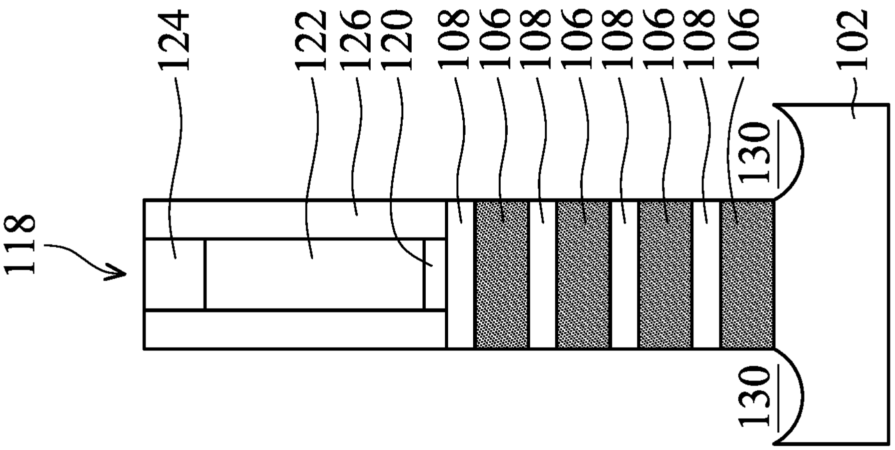
Figures 2, 2B:
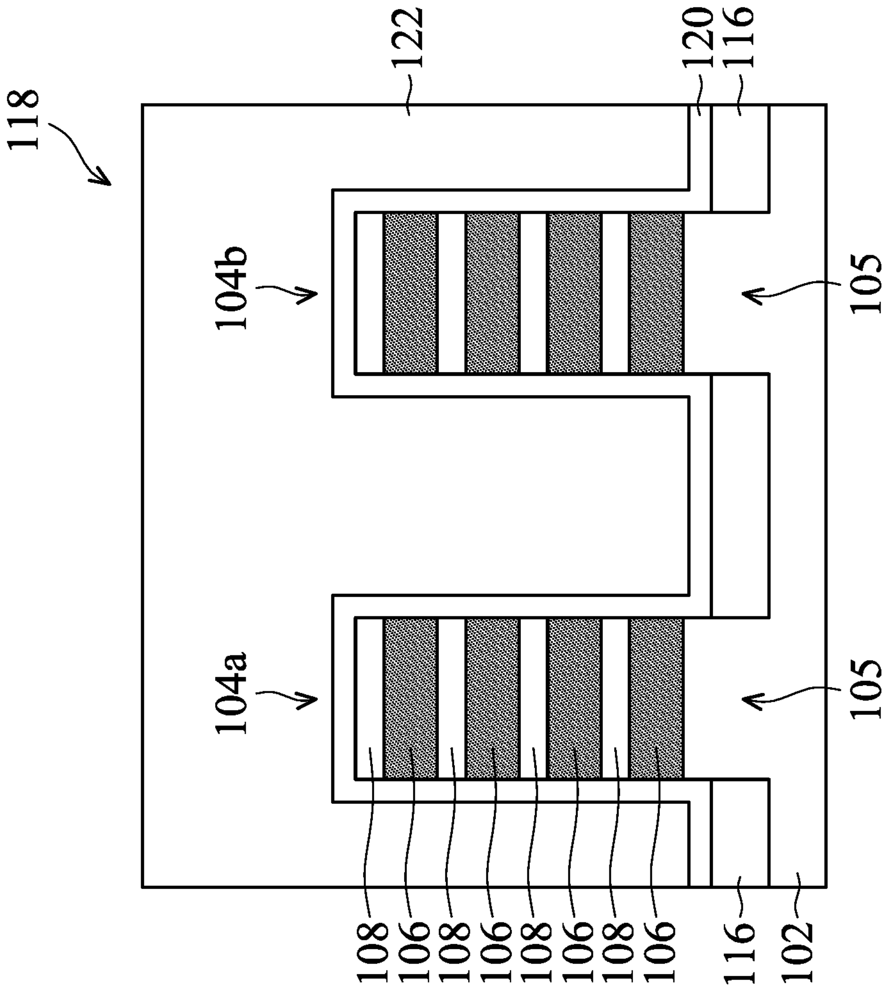
Figures 1, 2C:
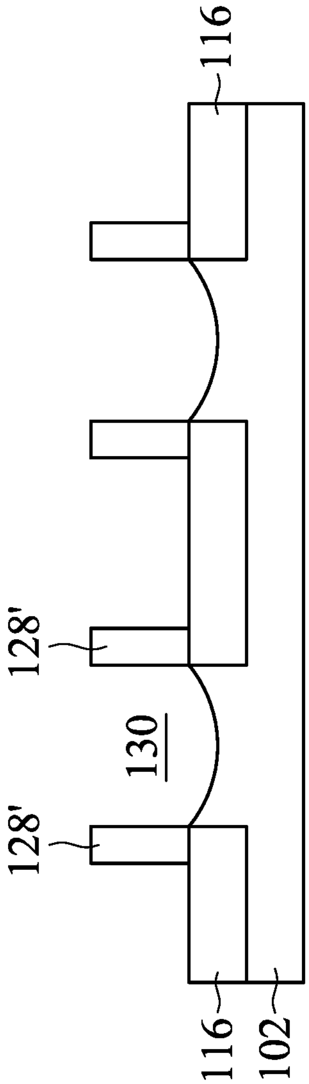
Figures 2, 2C, 3:
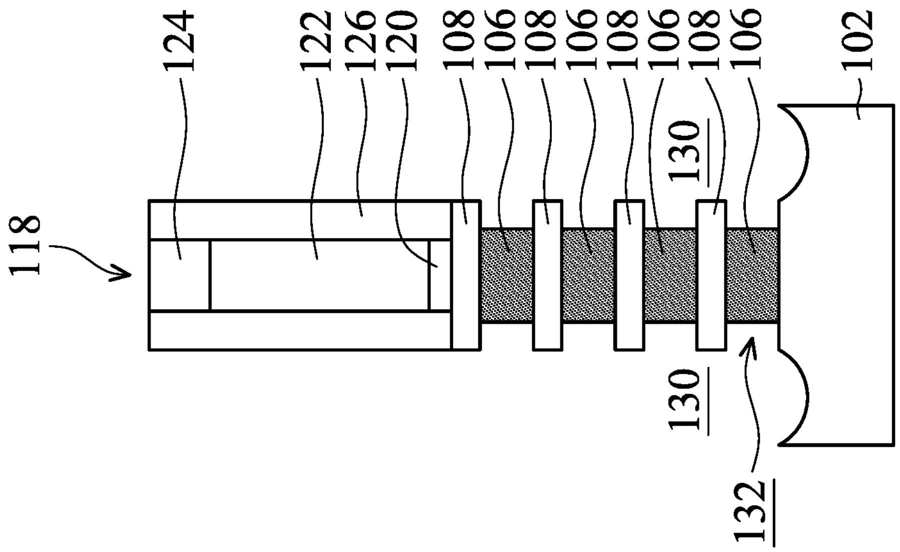
Figures 2, 2C:
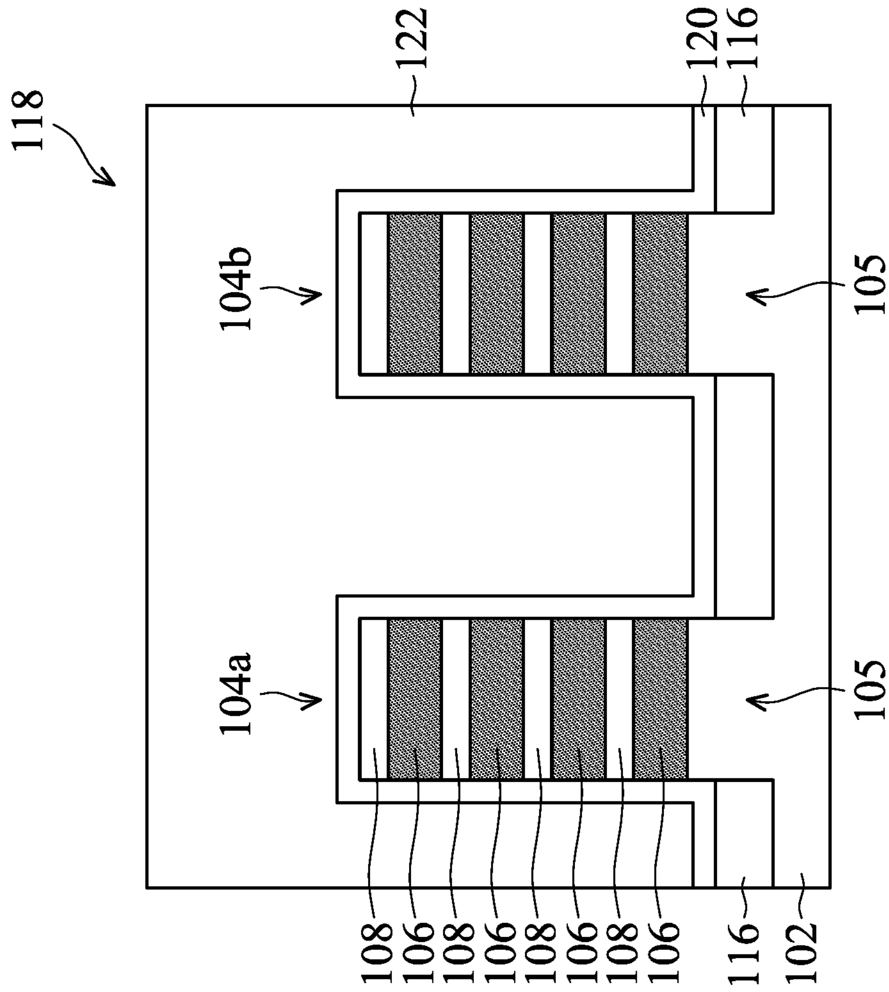
Figures 1, 2D:
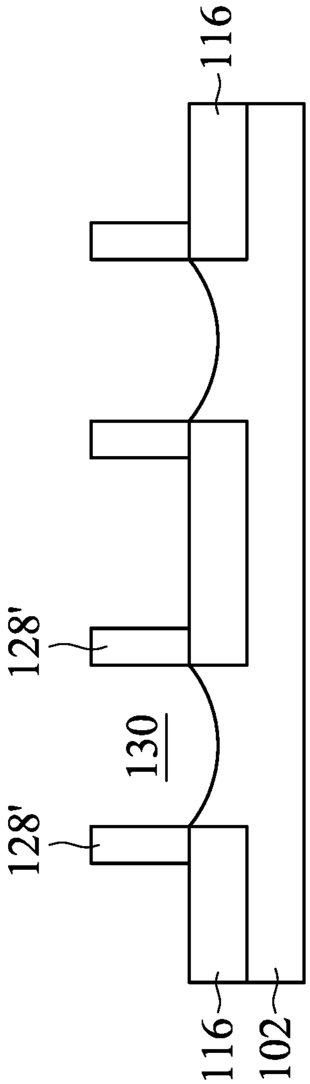
Figures 2, 2D, 3:
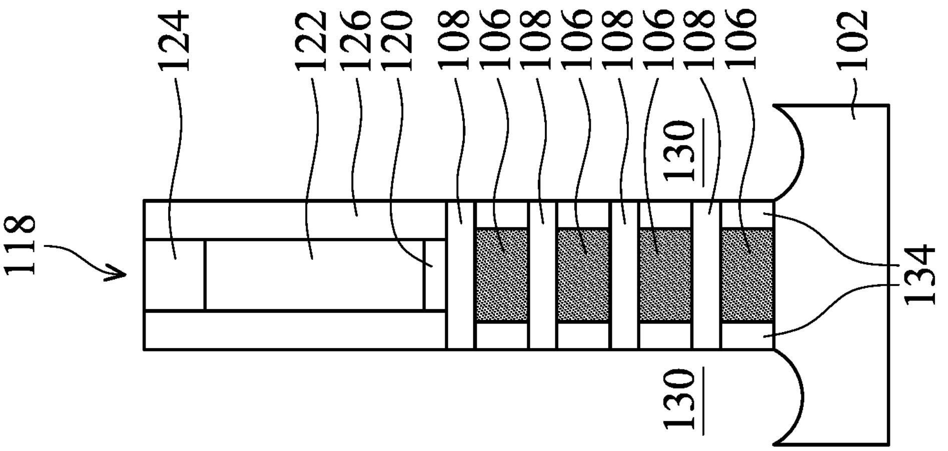
Figures 2, 2D:
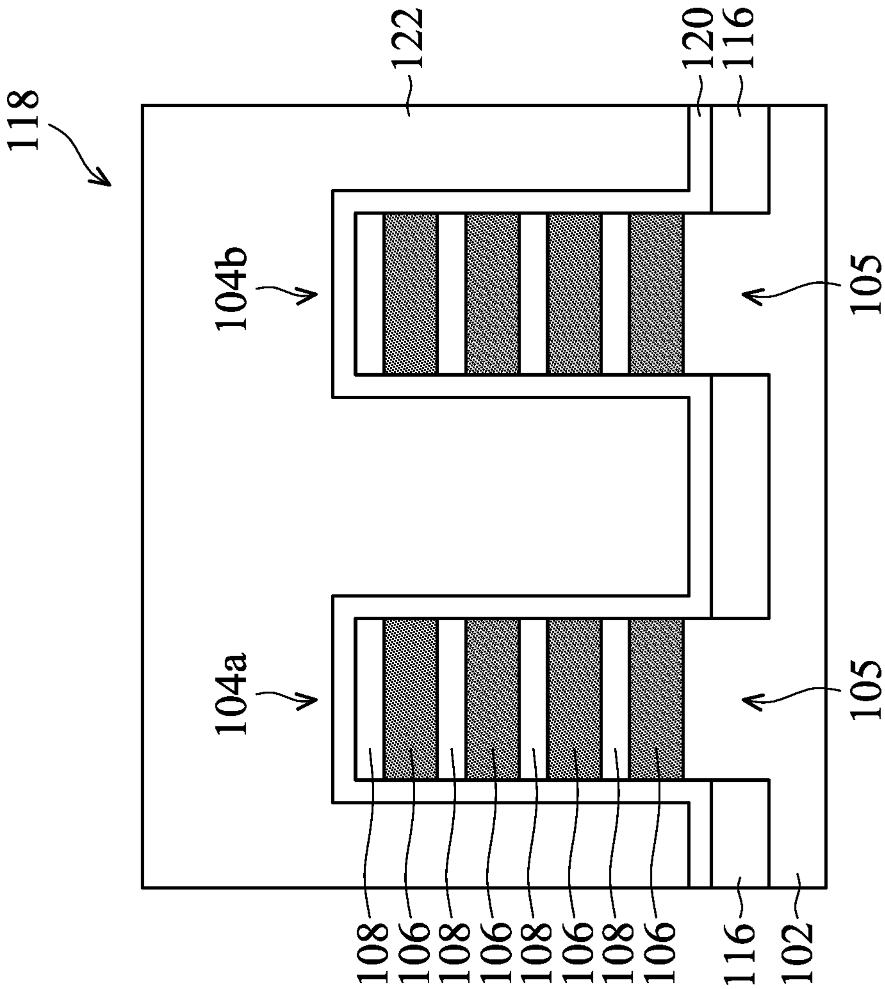
Figures 1, 2E:
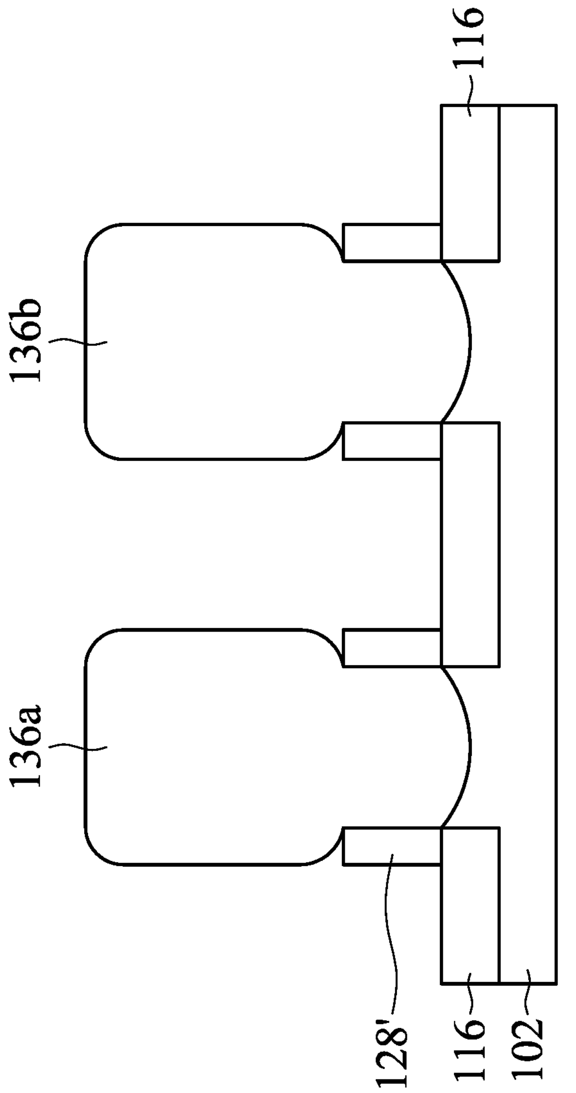
Figures 2, 2E, 3:
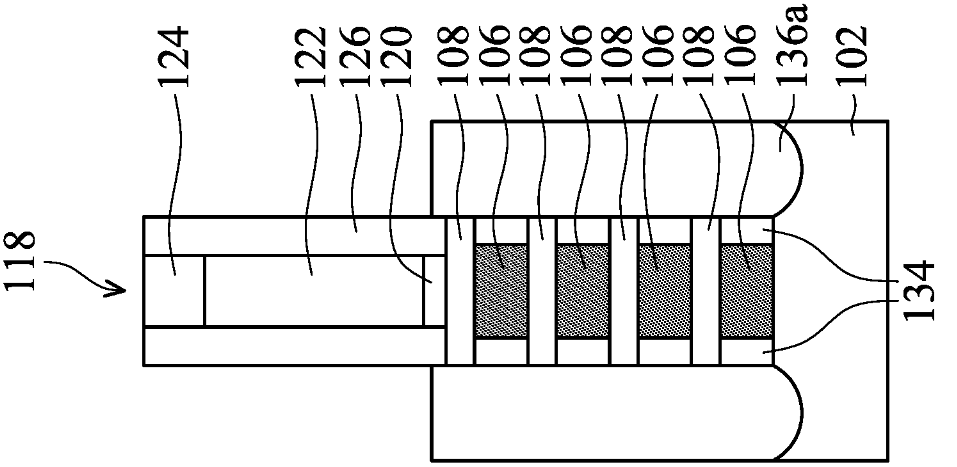
Figures 2, 2E:
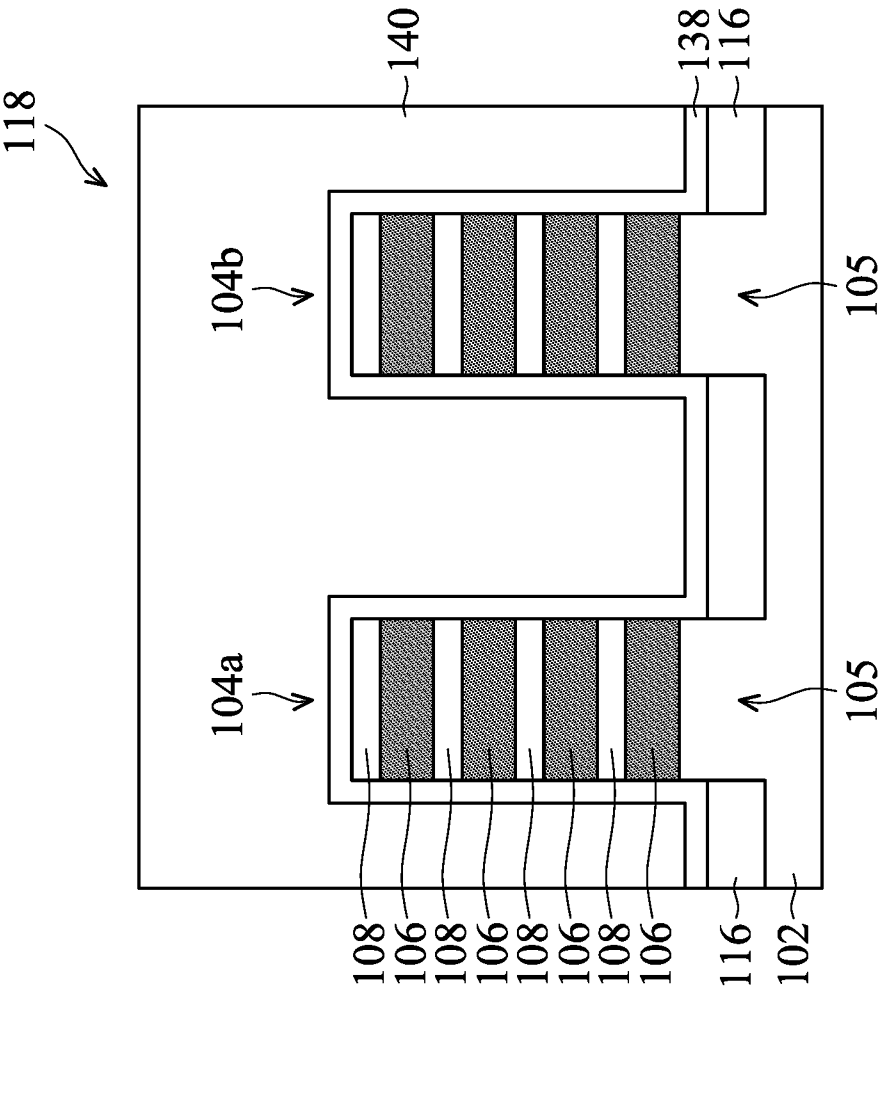
Figures 1, 2F:
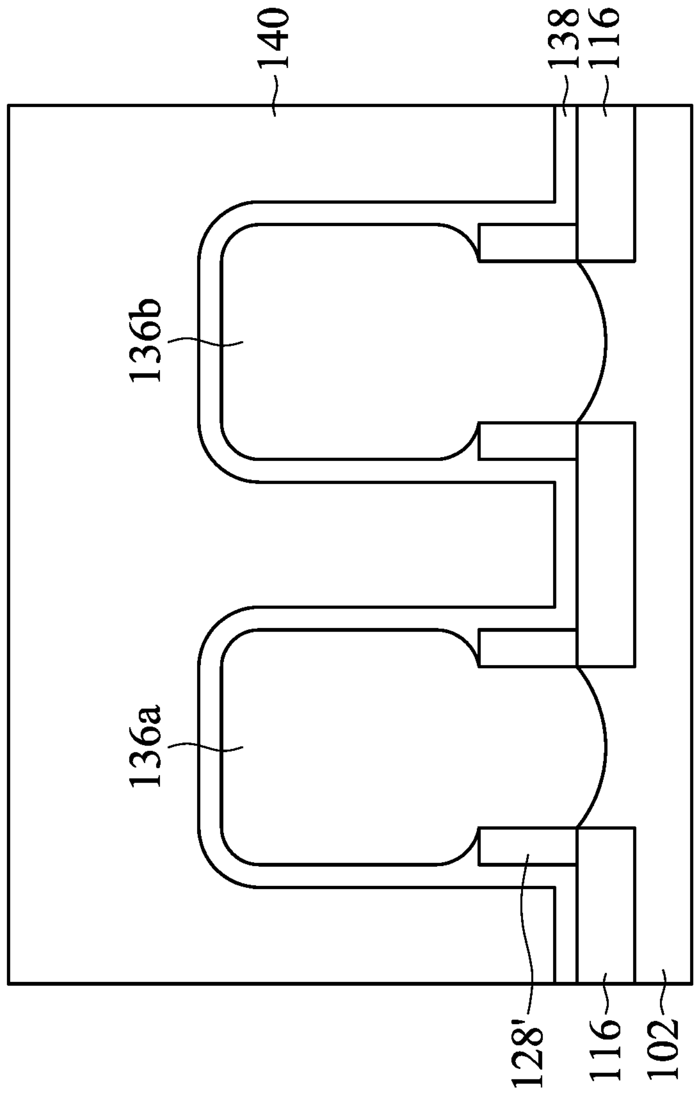
Figures 2, 2F, 3:
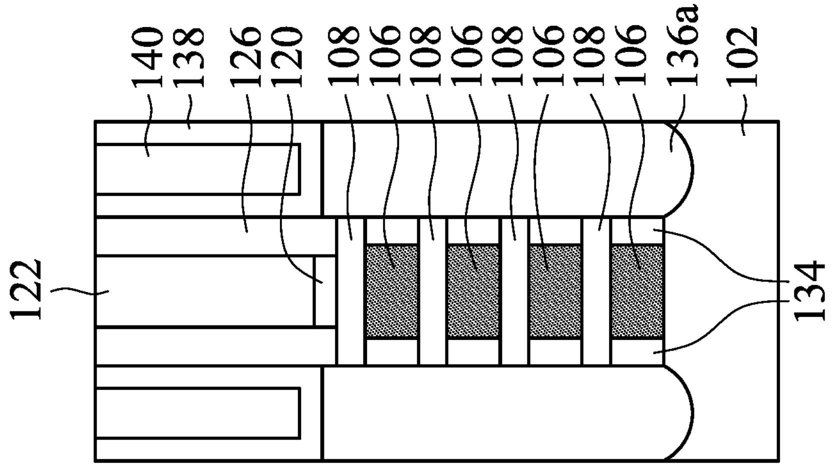
Figures 2, 2F:
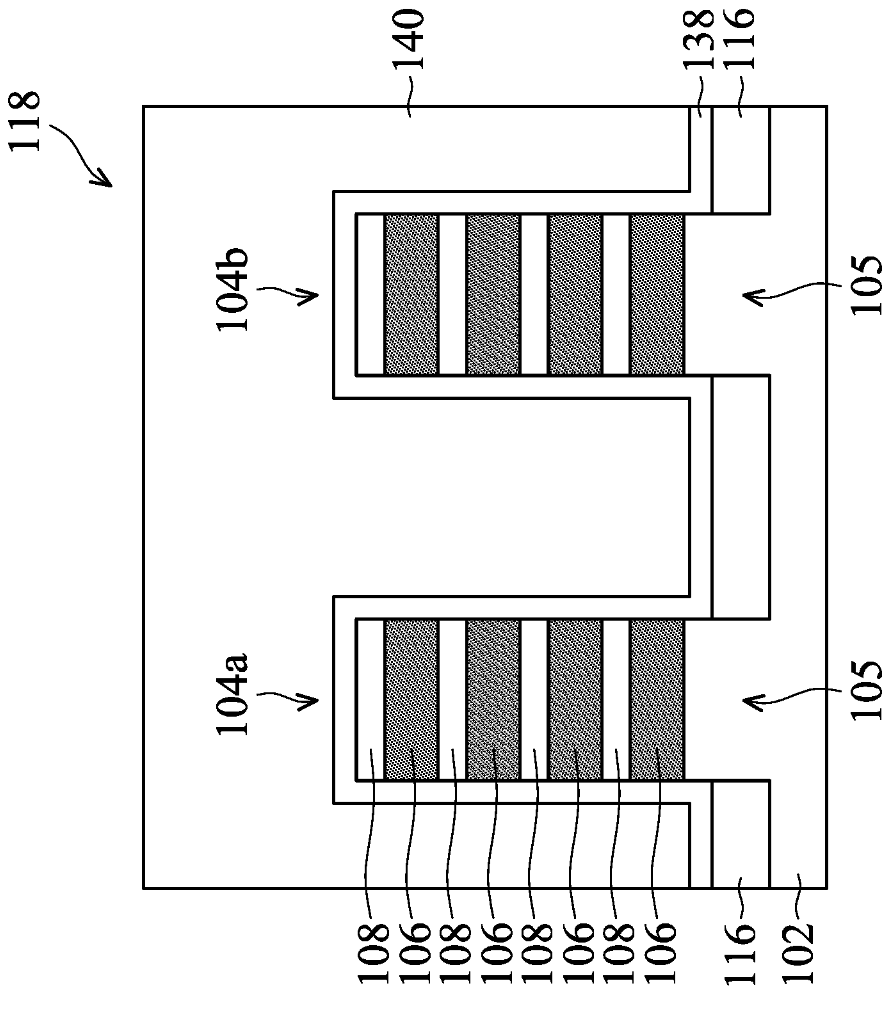
Figures 1, 2G:
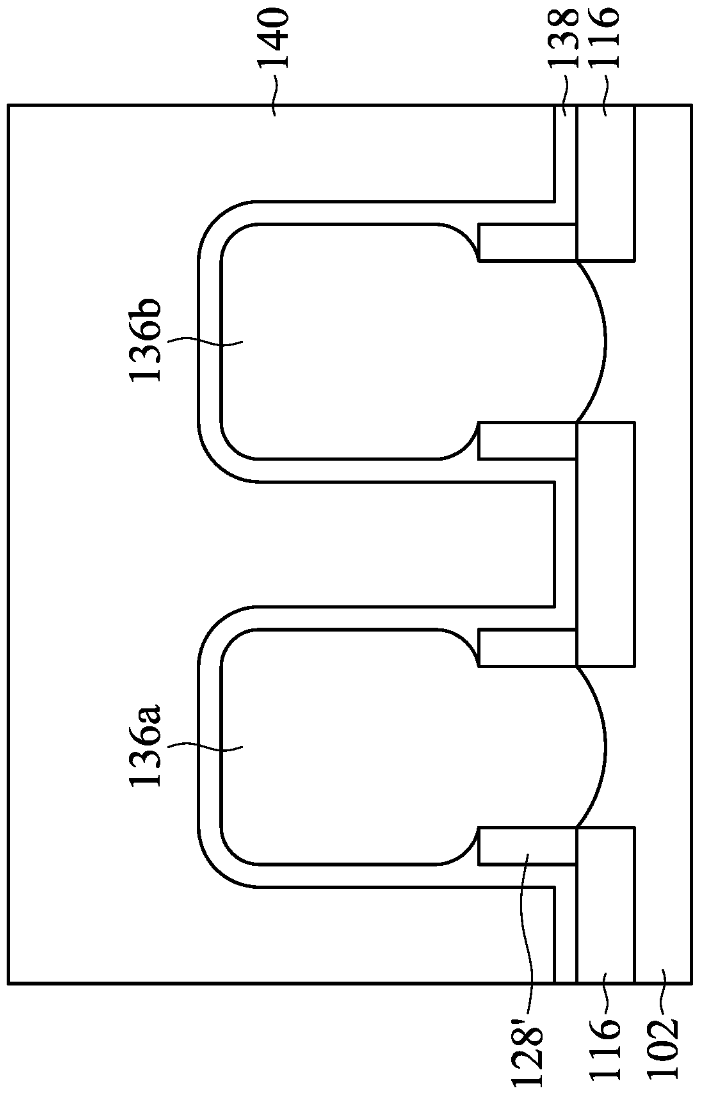
Figures 2, 2G, 3:
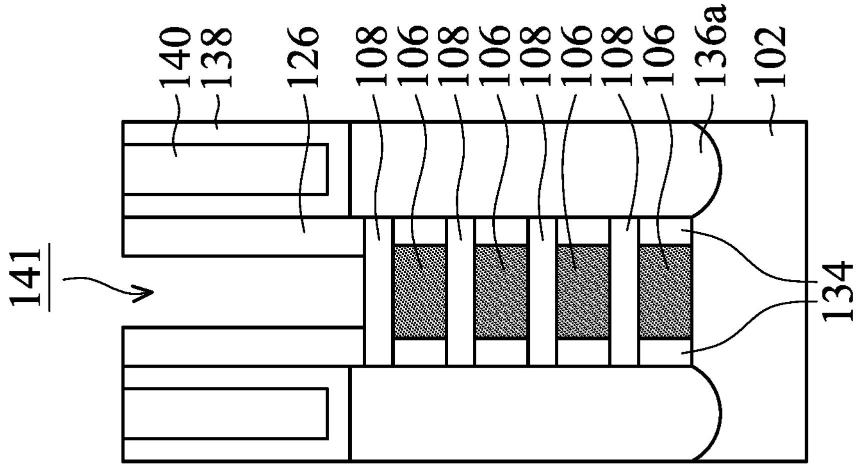
Figures 2, 2G:
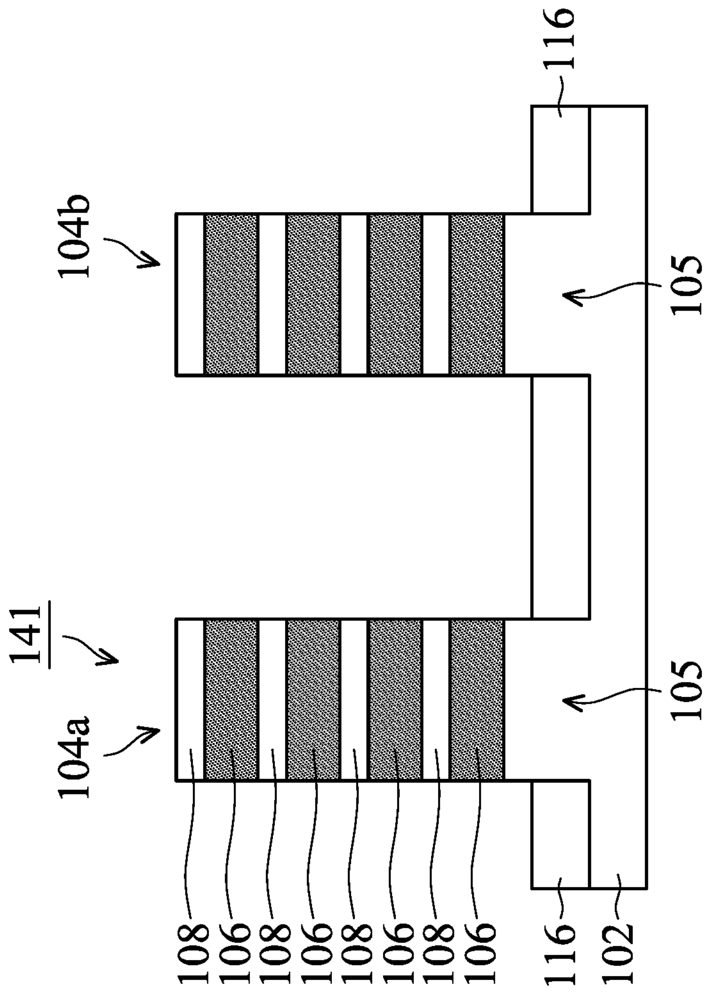
Figures 1, 2H:
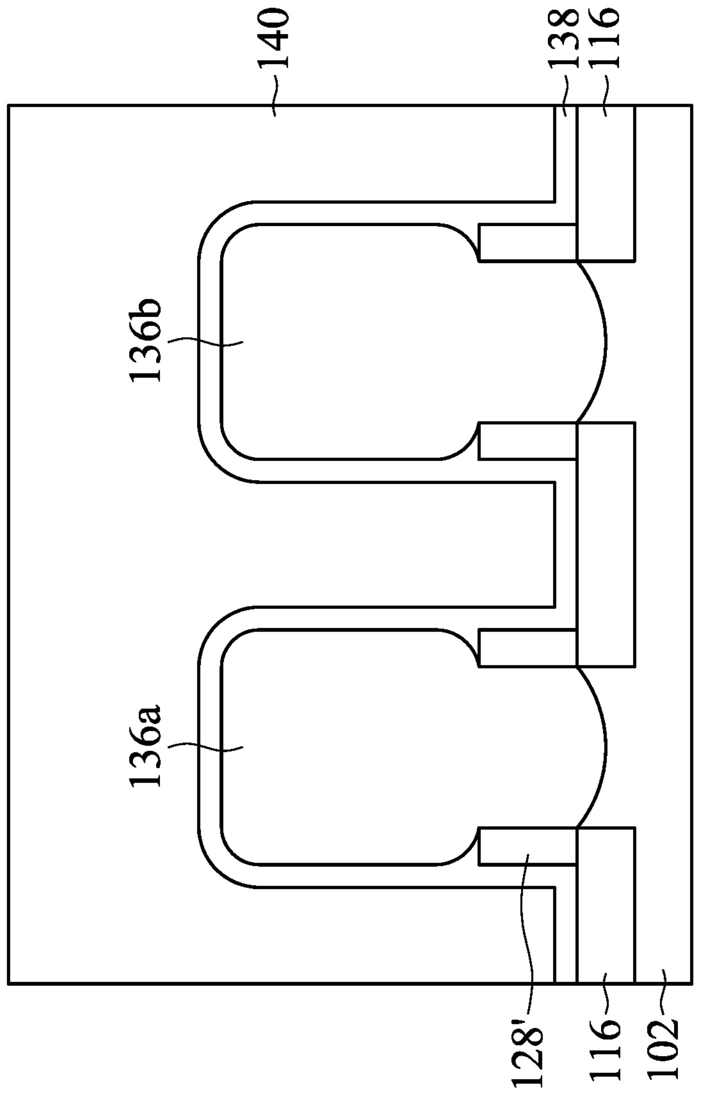
Figures 2, 2H, 3:
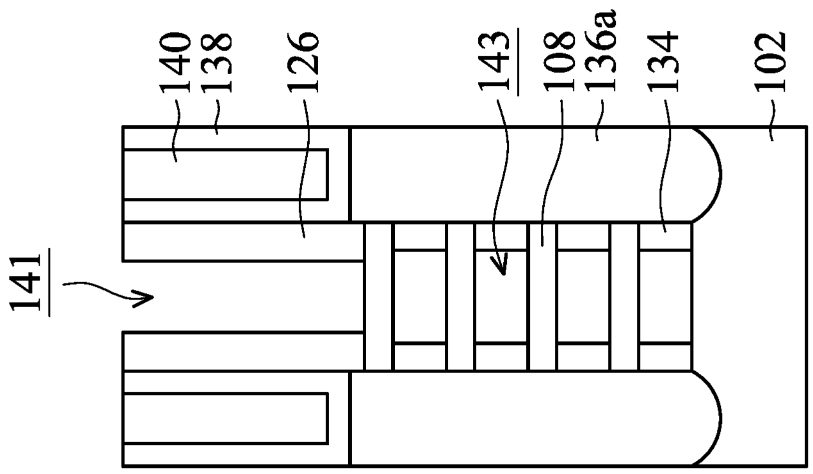
Figures 2, 2H:
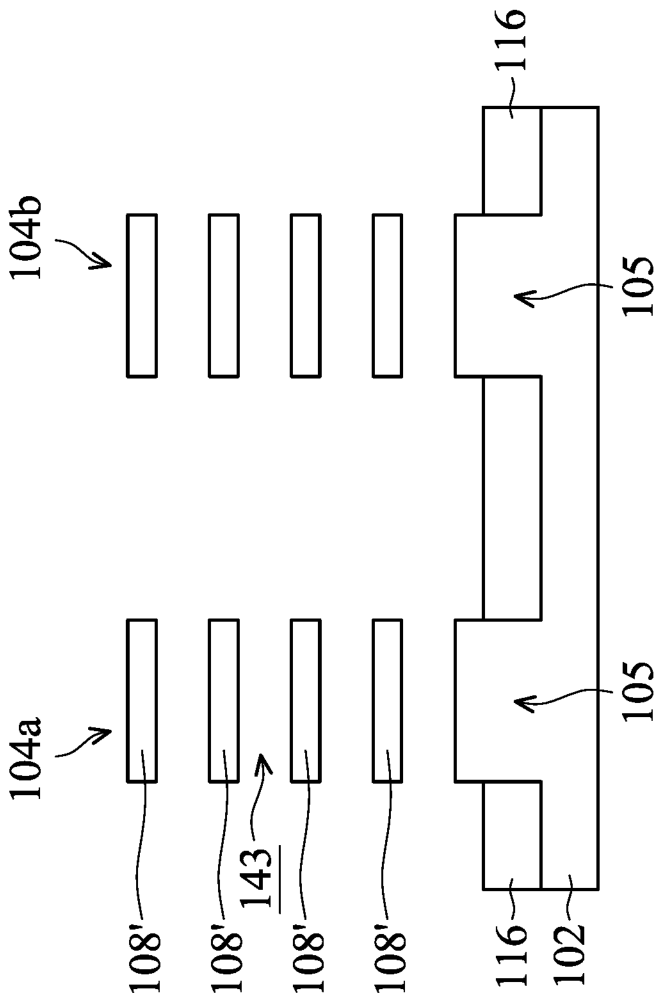
Figures 1, 2I:
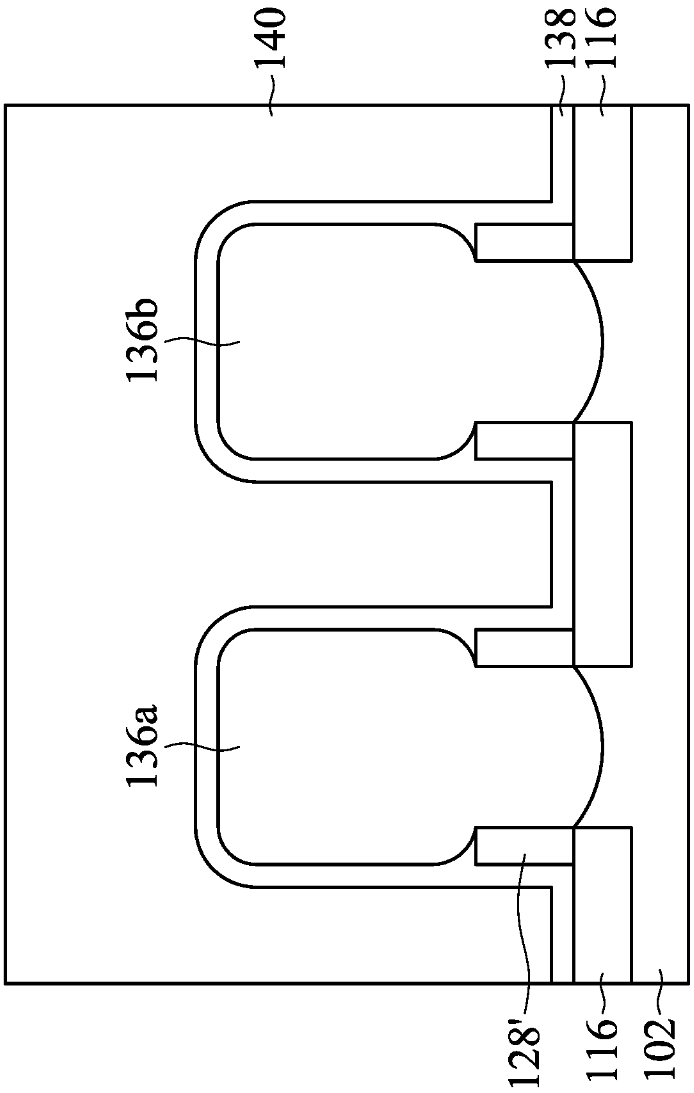
Figures 2, 2I:
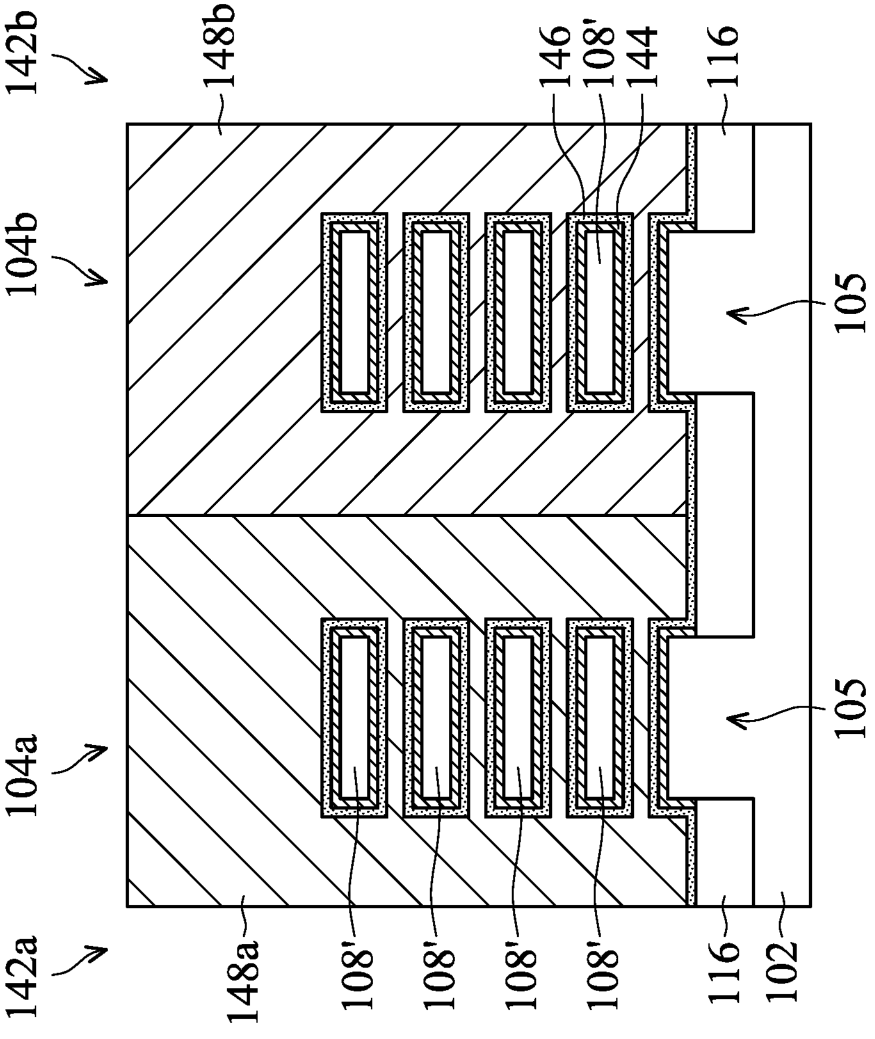
Figures 2, 2I, 3:
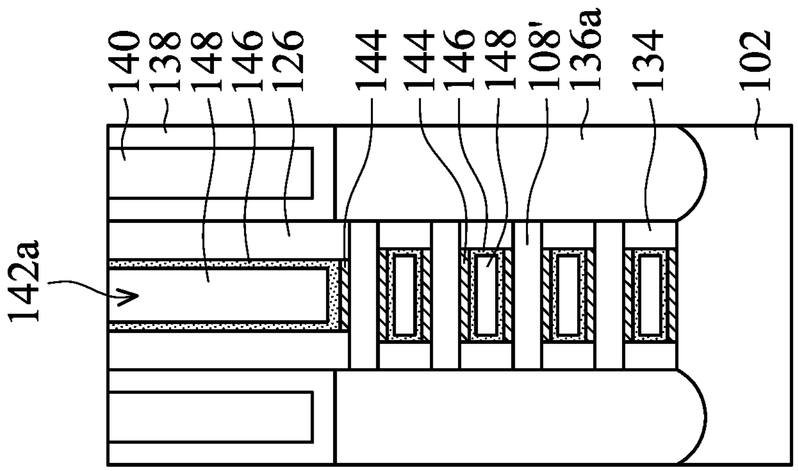
Figures 1, 2J:
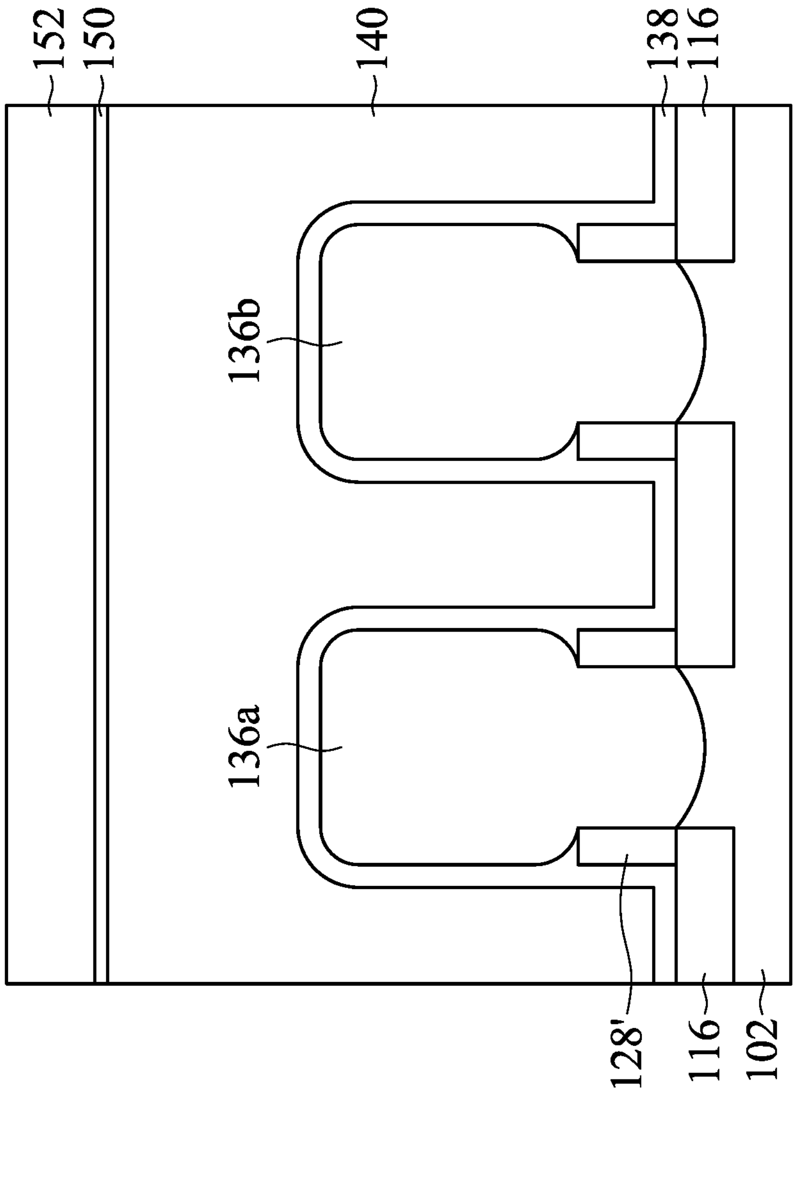
Figures 2, 2J, 3:
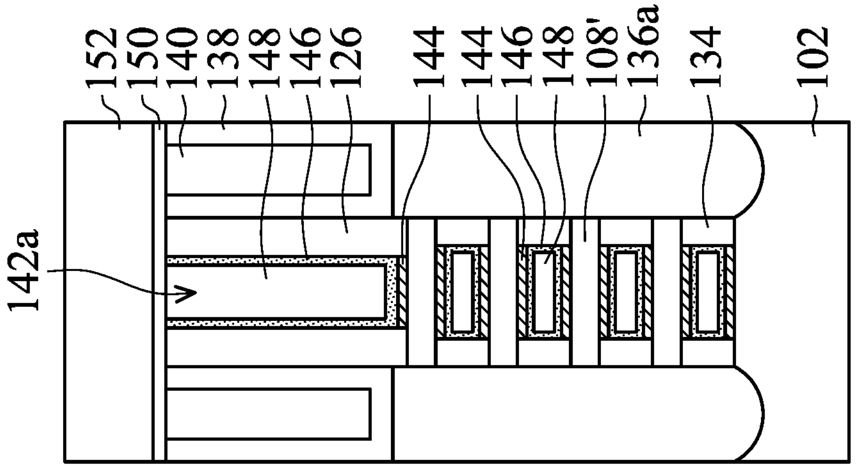
Figures 2, 2J:
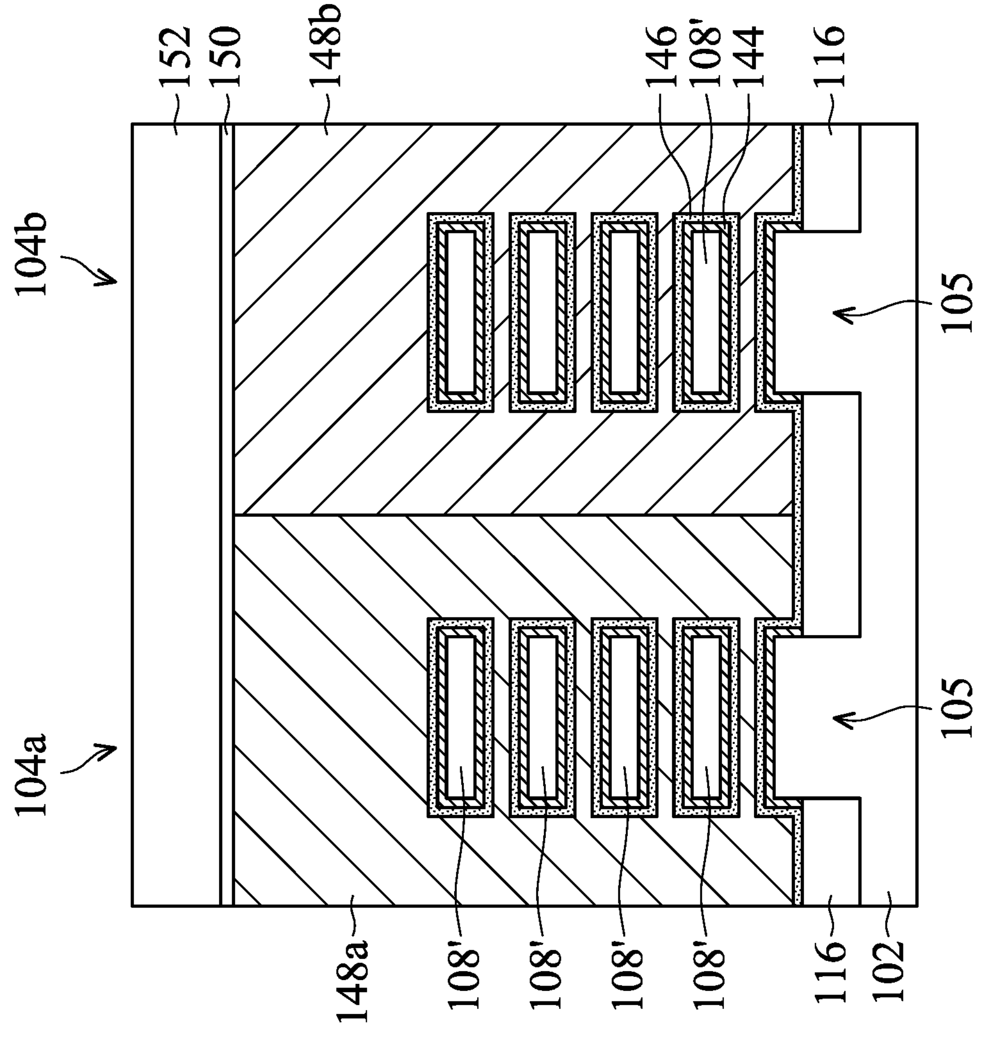
Figures 1, 2K:
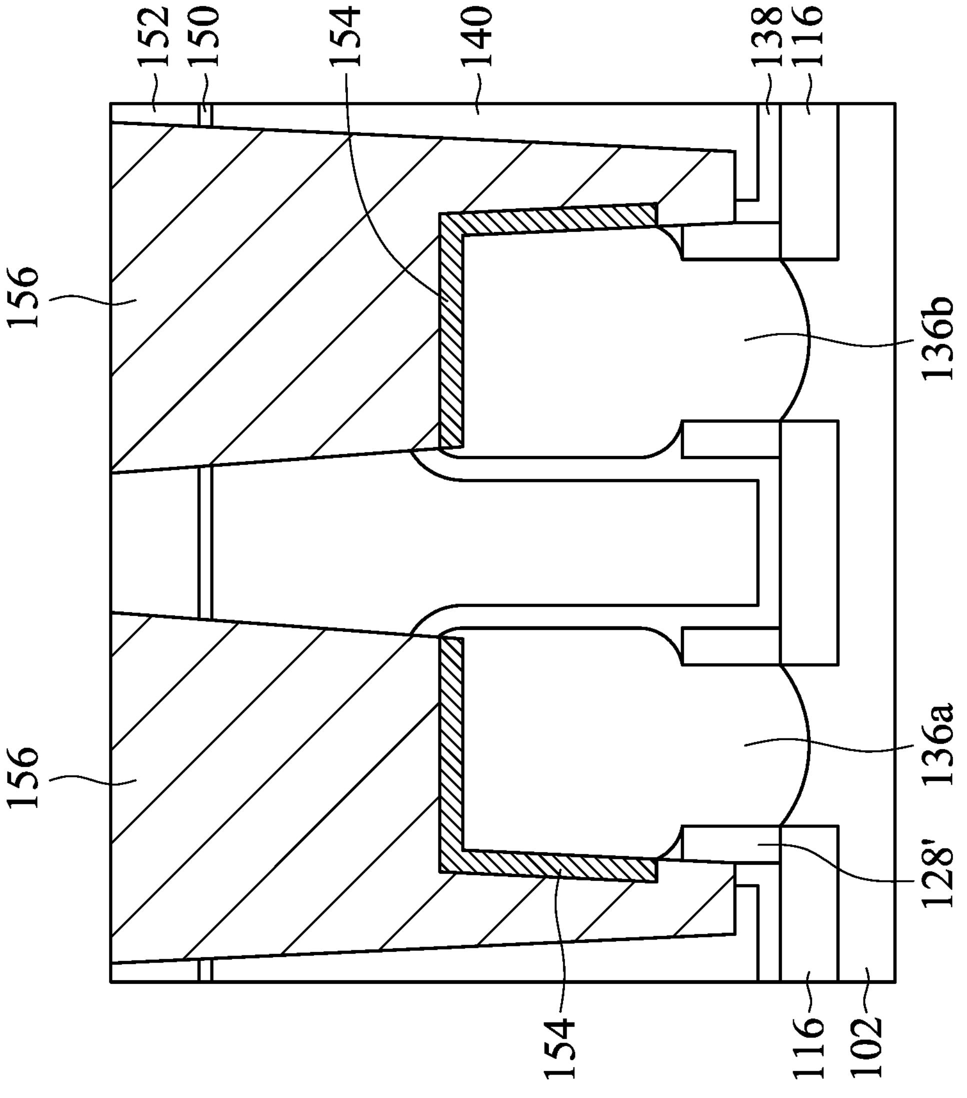
Figures 2, 2K, 3:
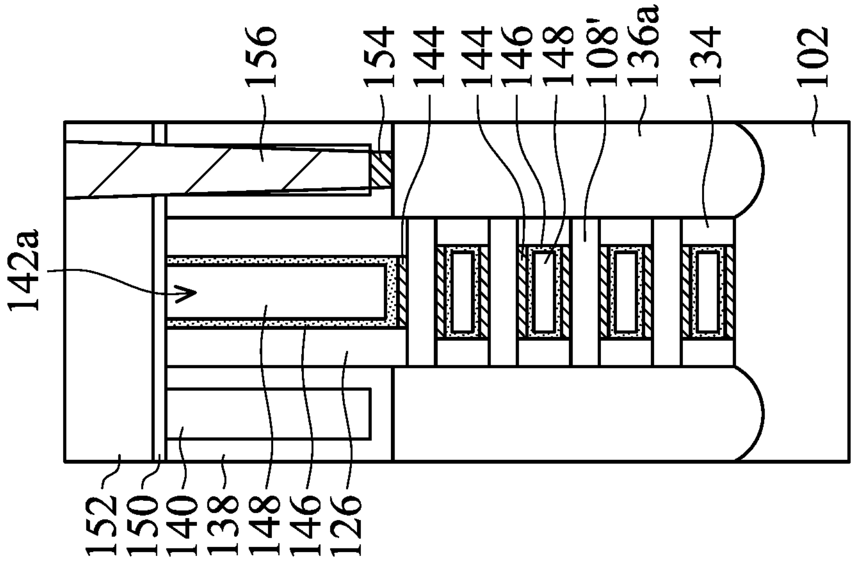
Figures 2, 2K:
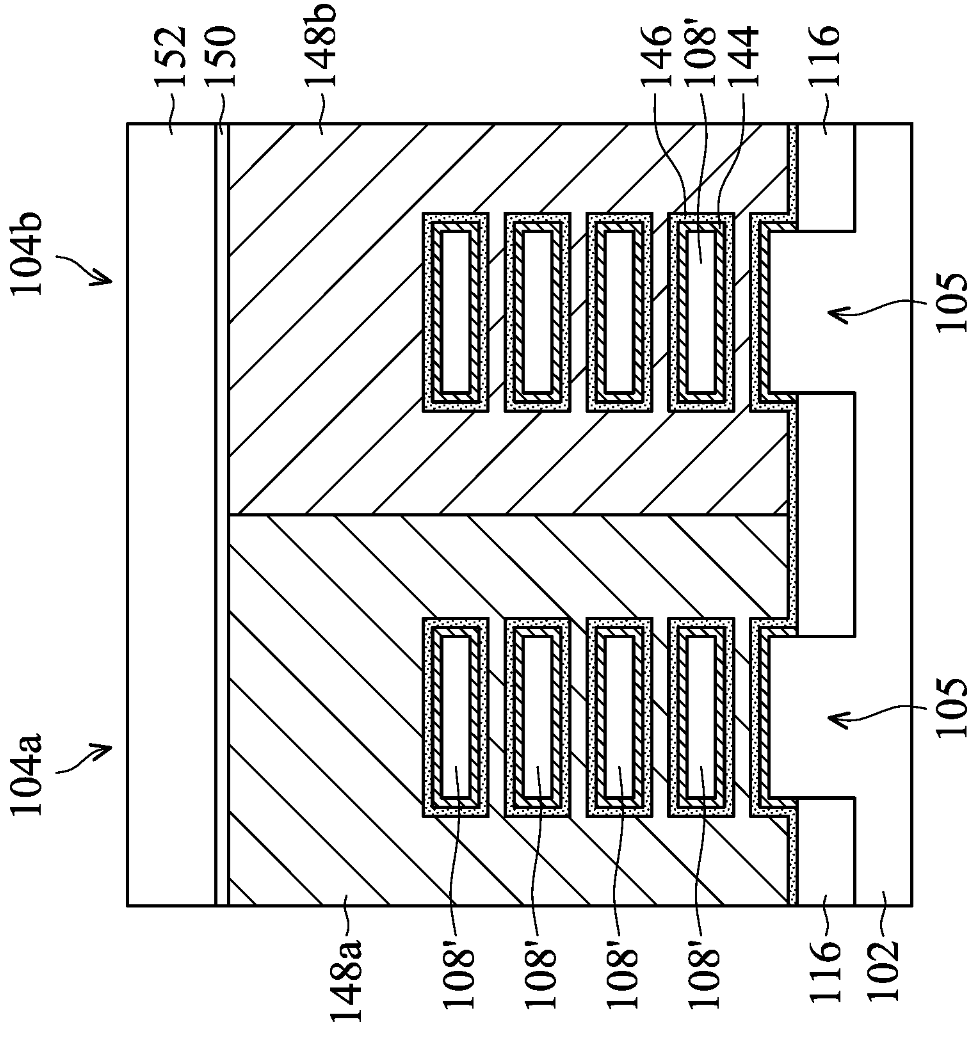
Figures 1, 2L:
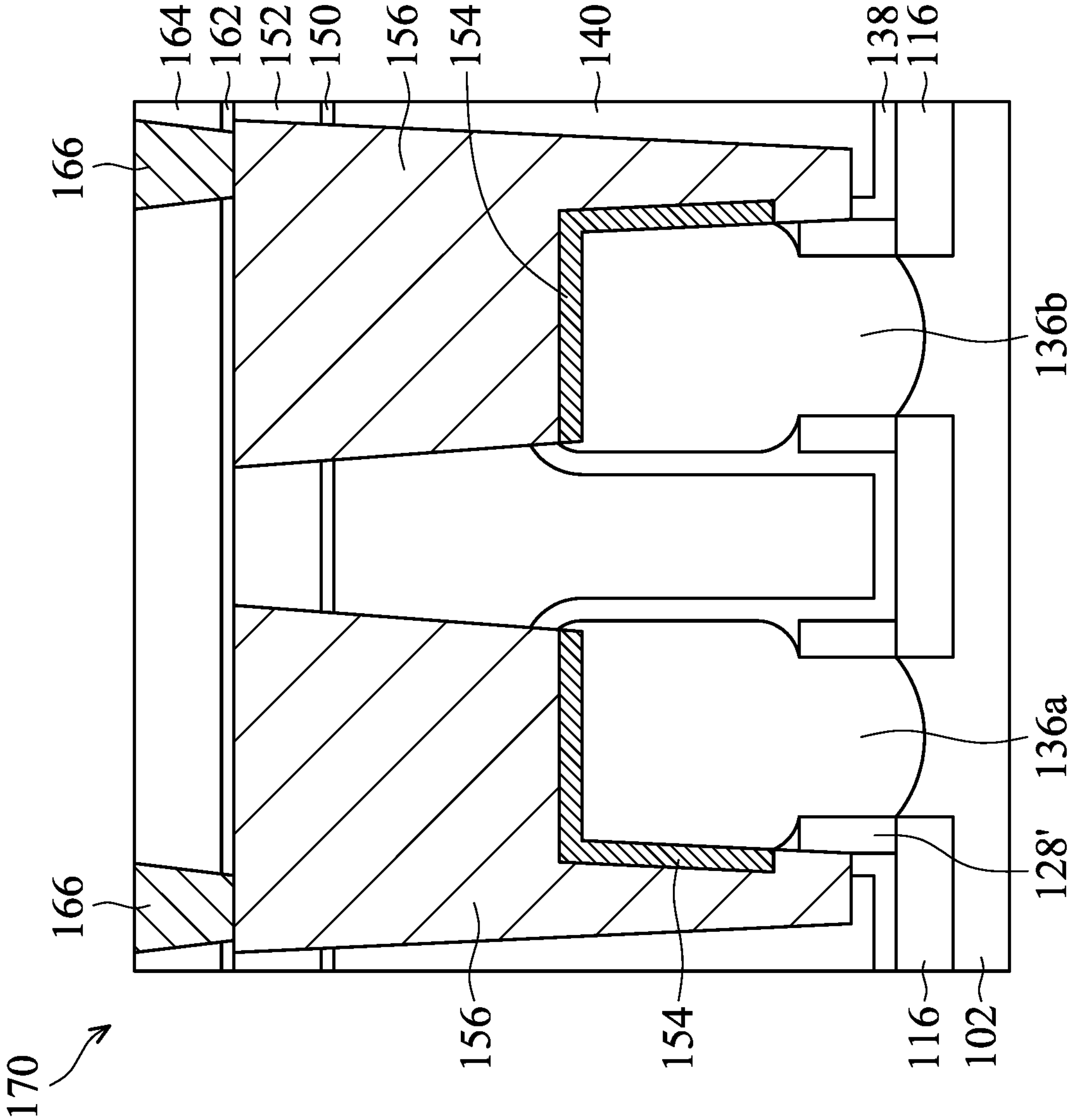
Figures 2, 2L:
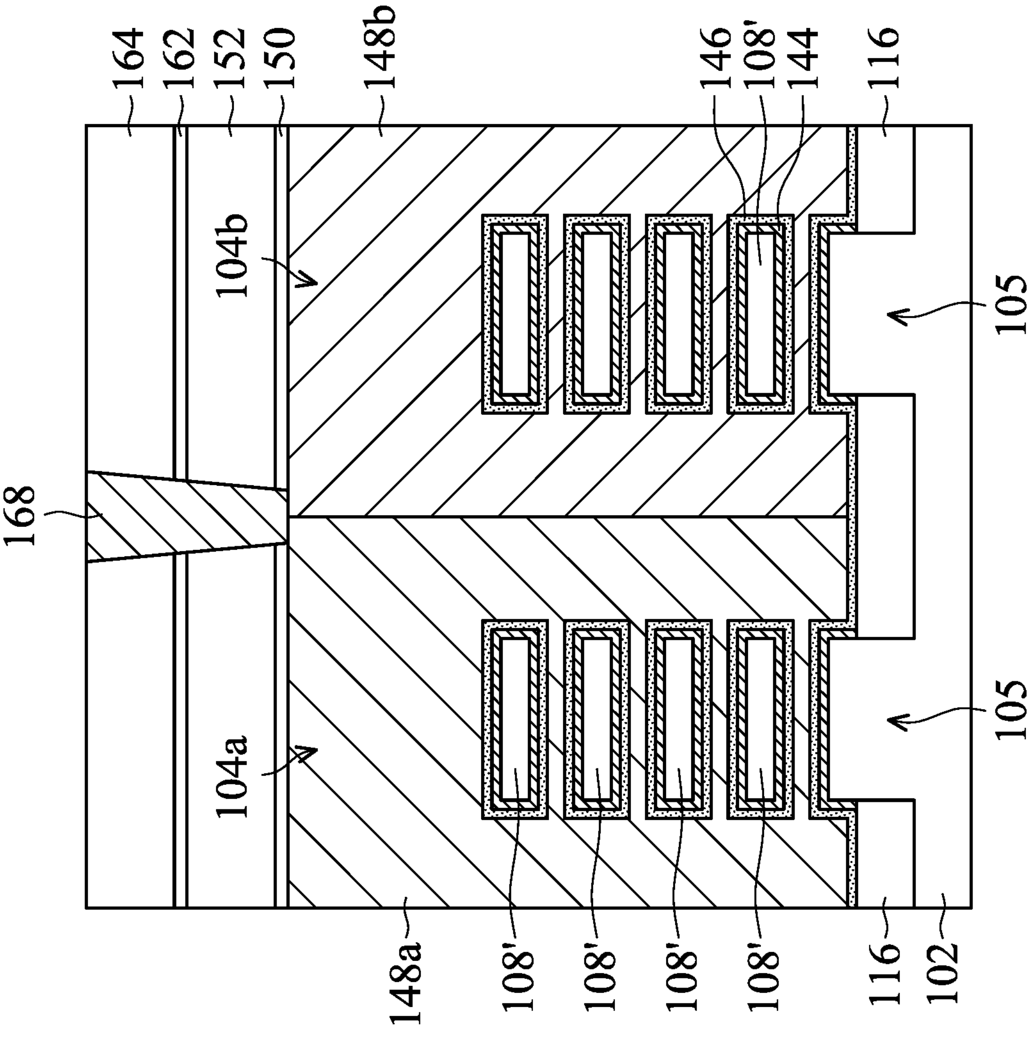
Figures 2, 2L, 3:
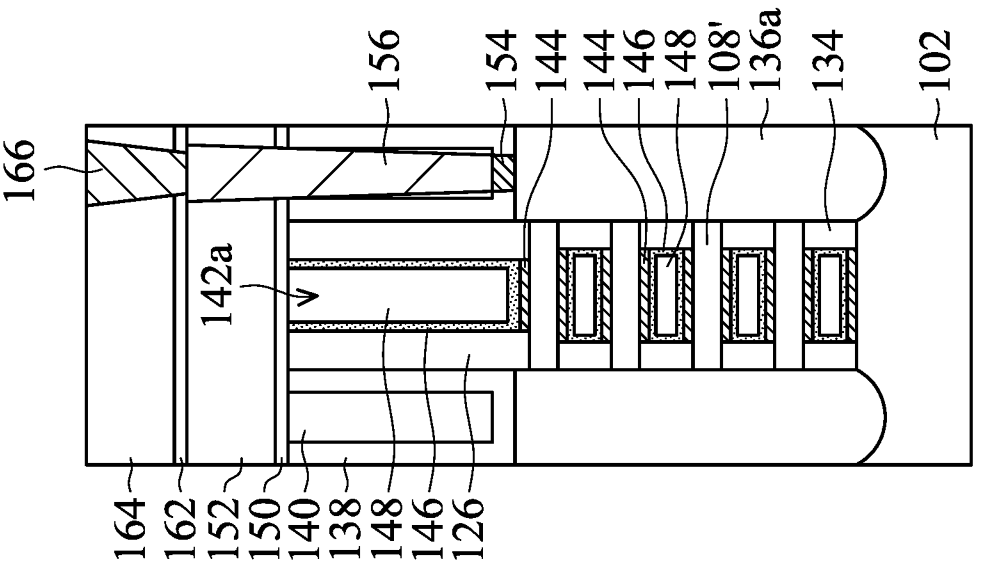
Figures 1, 2M:
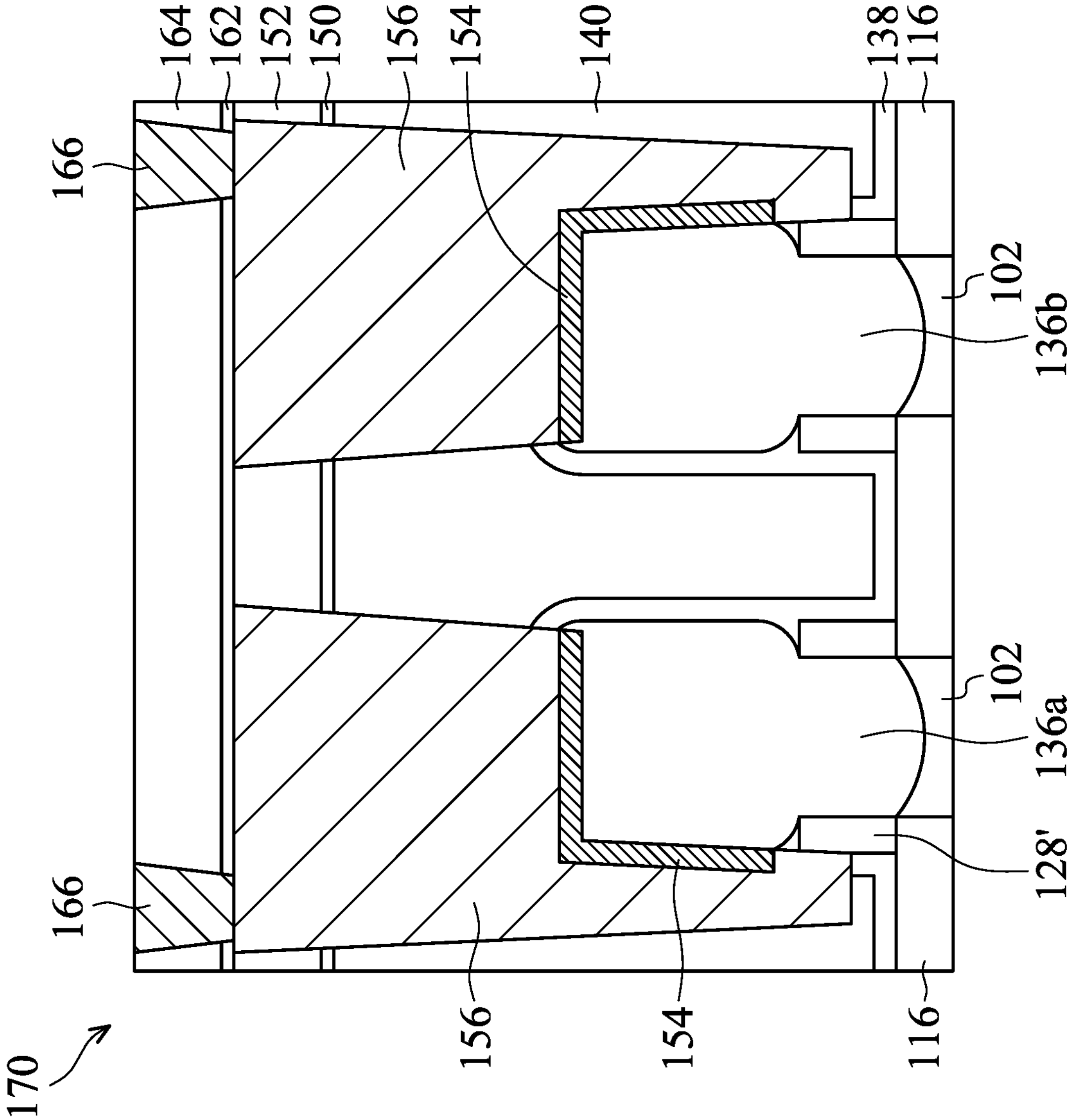
Figures 2, 2M, 3:
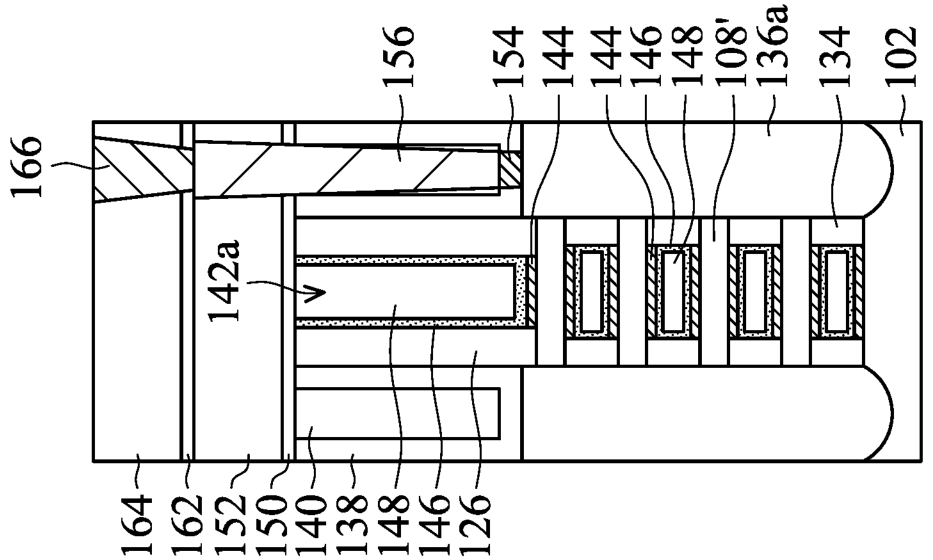
Figures 2, 2M:
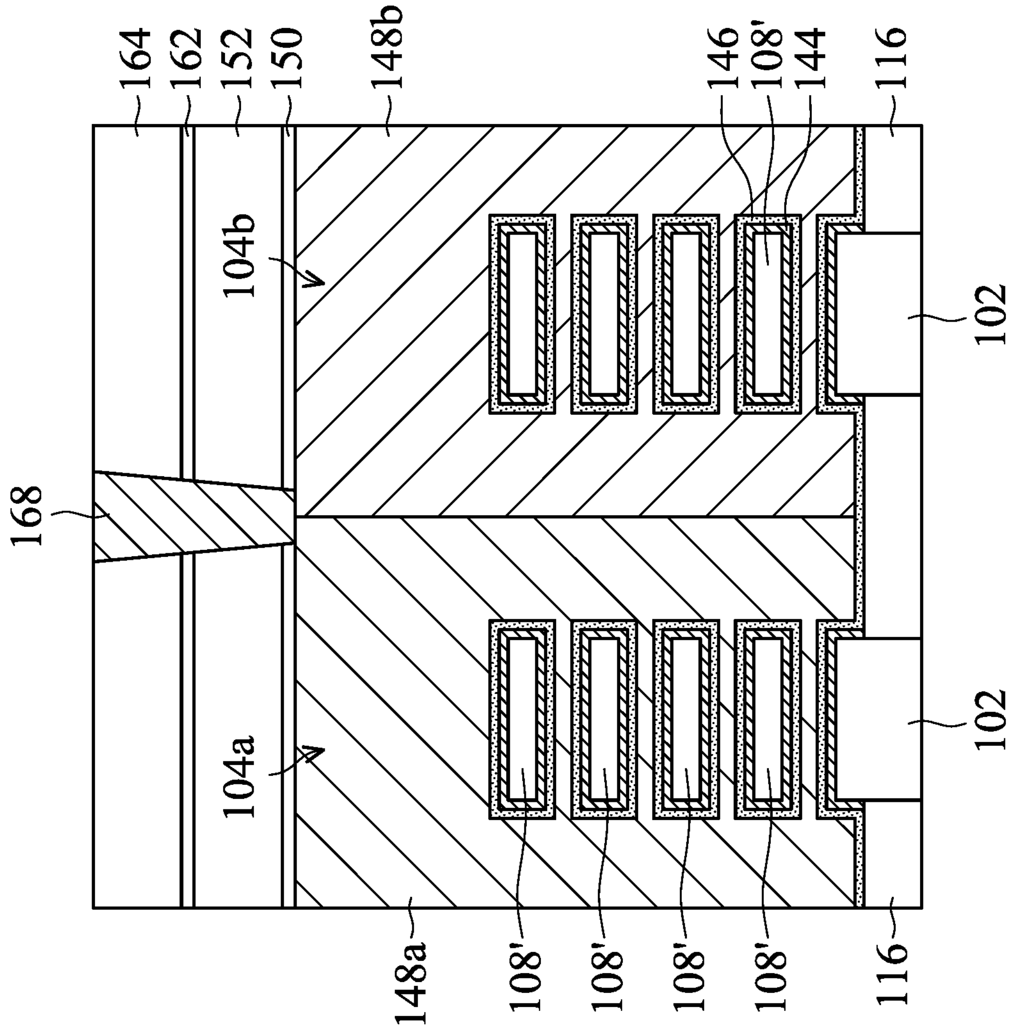
Figures 1, 2N:
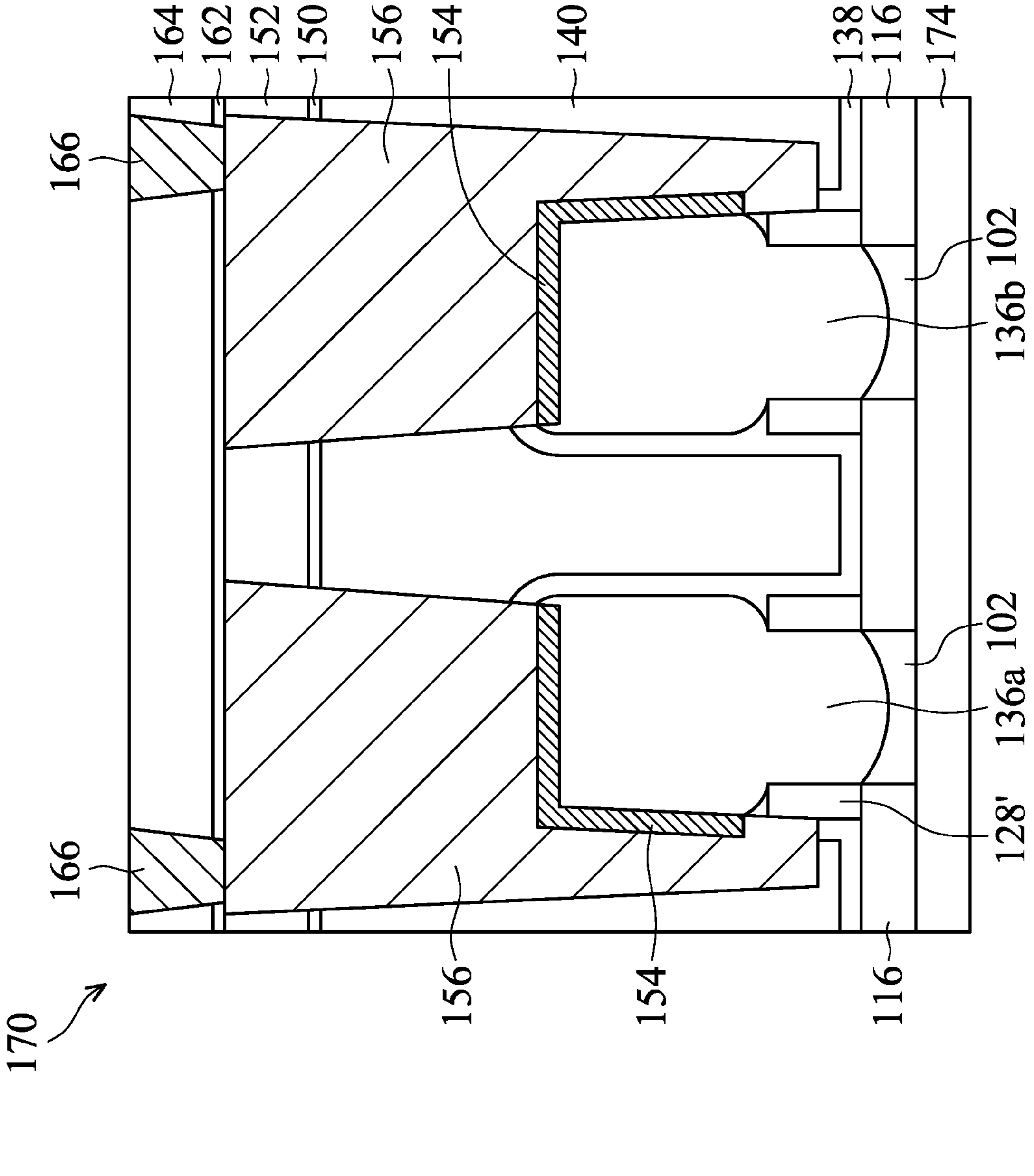
Figures 2, 2N:
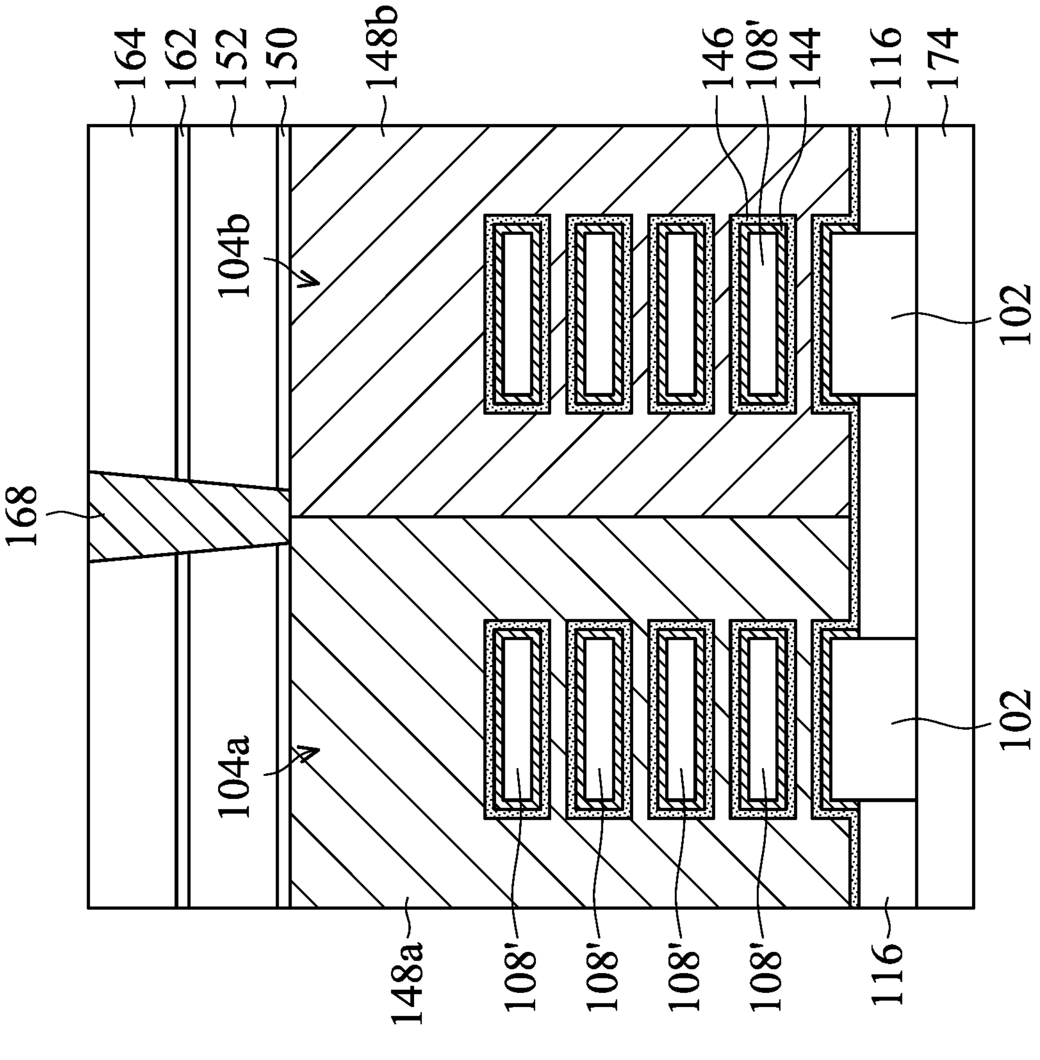
Figures 2, 2N, 3:
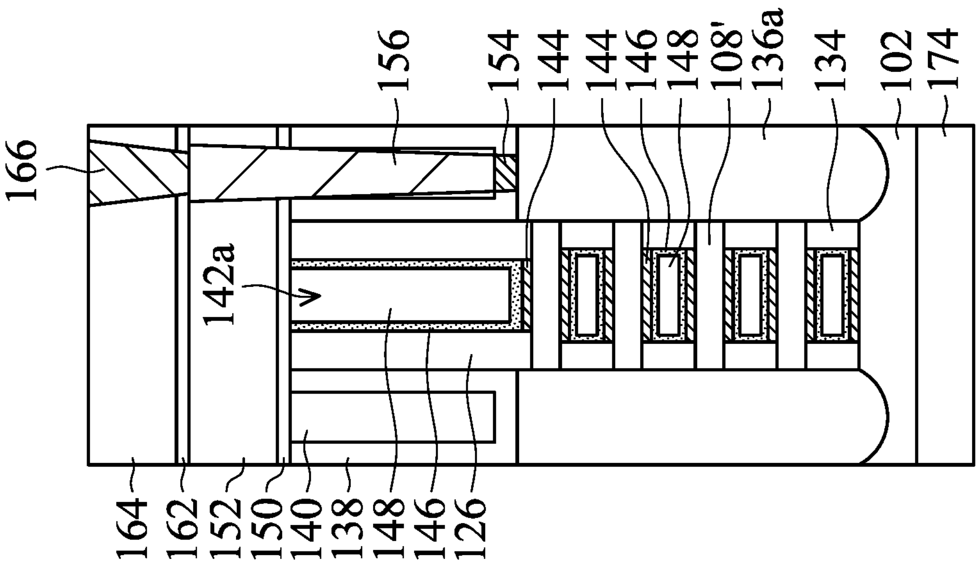
Figures 1, 2O:
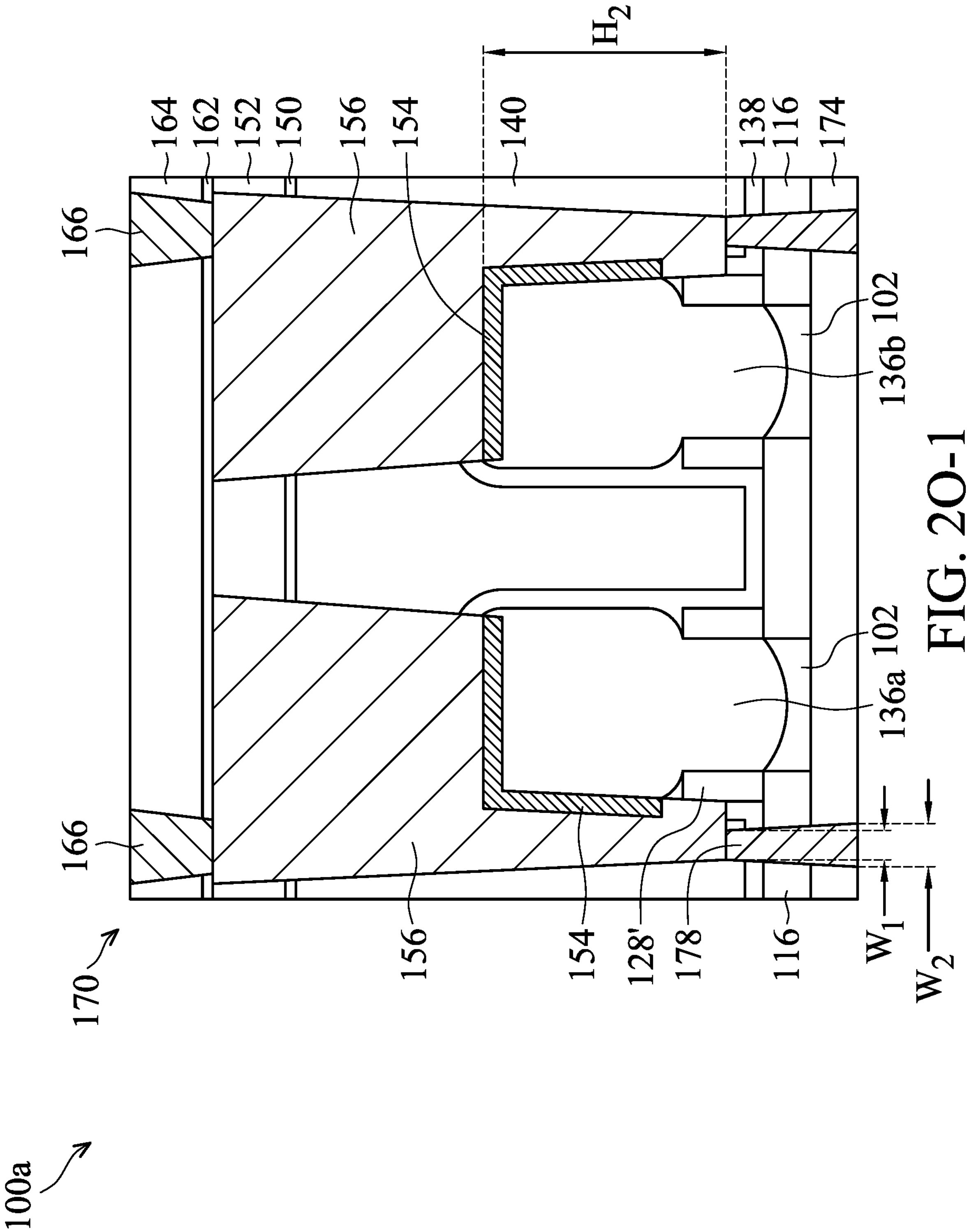
Figures 2, 2O, 3:
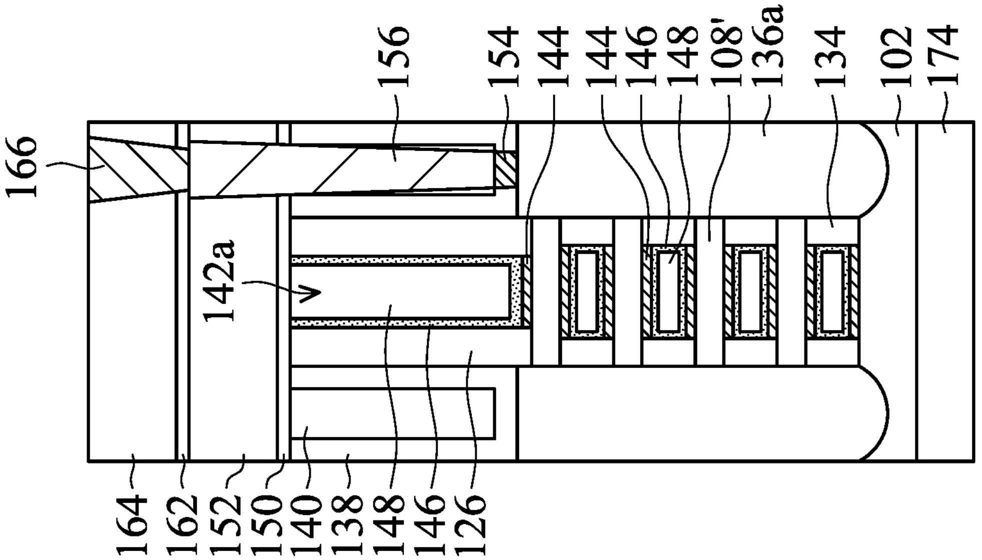
Figures 2, 2O:
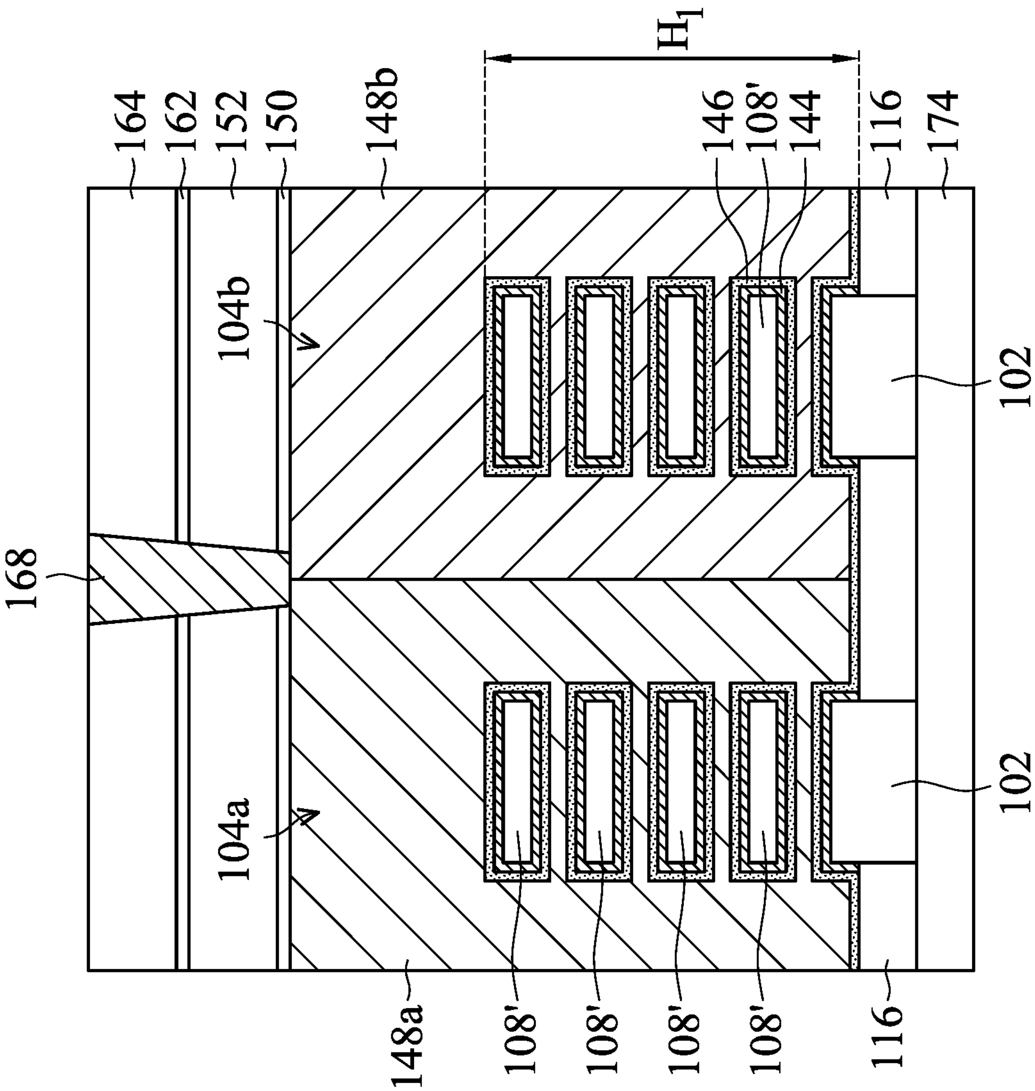
Figure 2O:
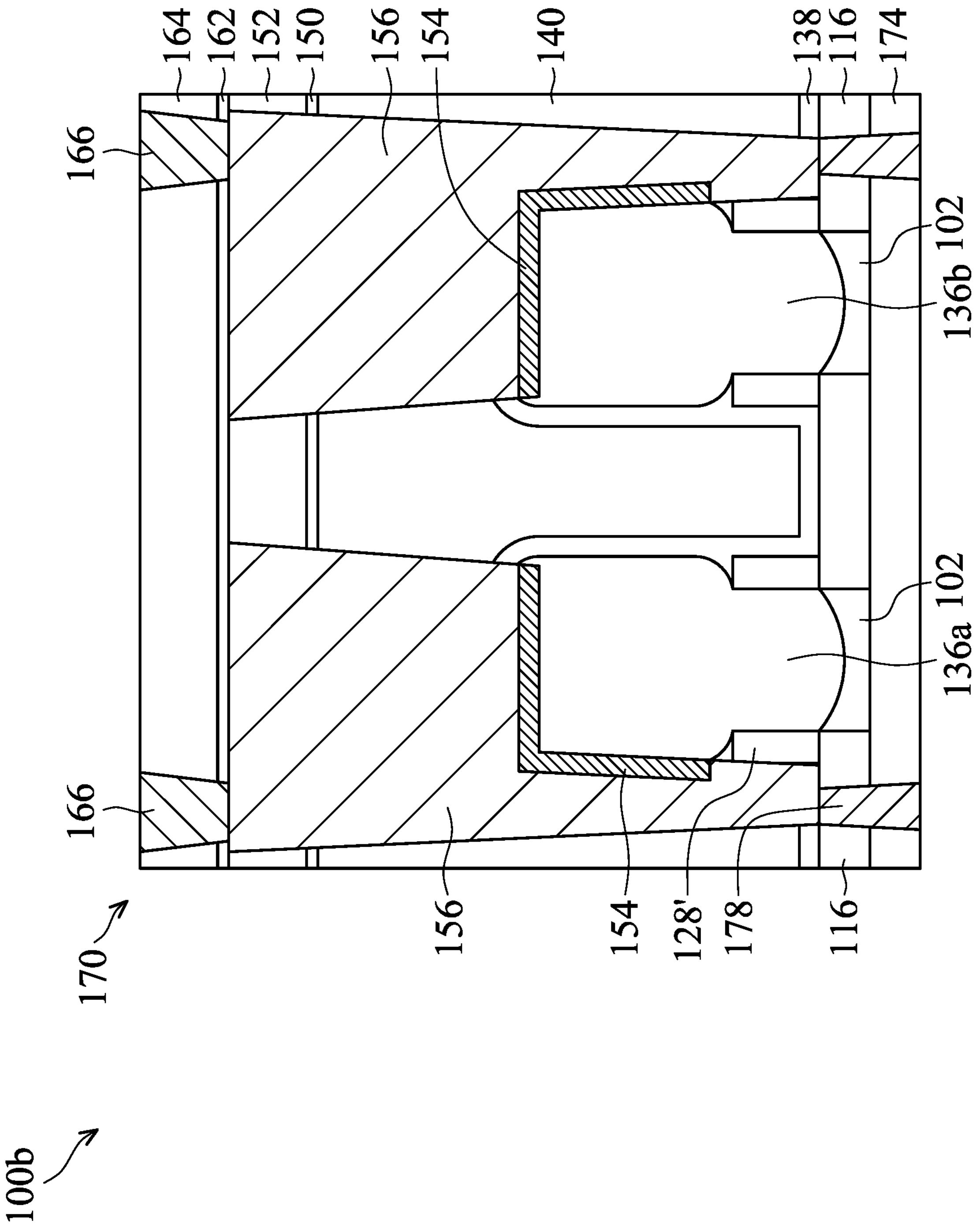
Figure 3:
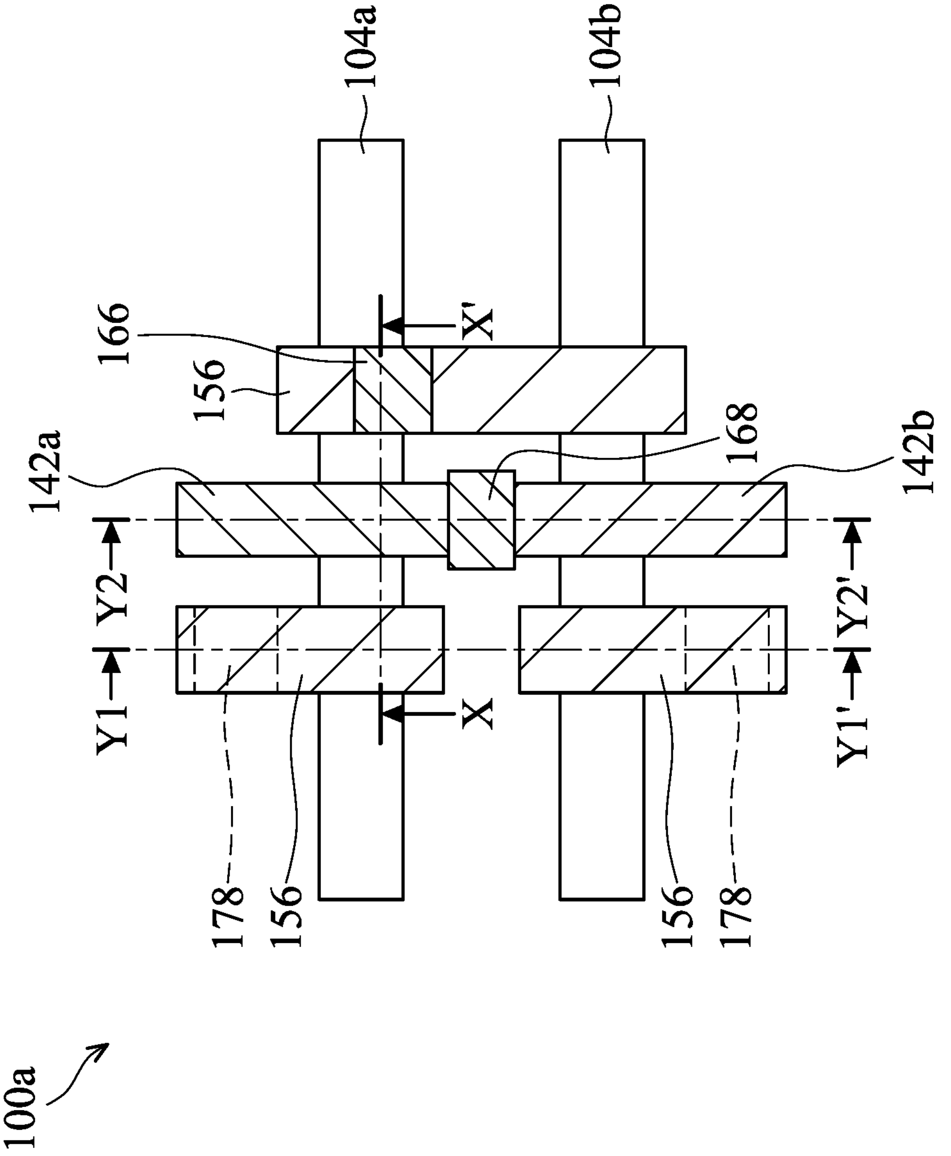

FIGS. 2A-1 to 2O-1 illustrate cross-sectional representations of various stages of manufacturing the semiconductor structure 100*a* shown along line A-A' in FIG. 1E, in accordance with some embodiments. FIGS. 2A-2 to 2O-2 illustrate cross-sectional representations of various stages of manufacturing the semiconductor structure 100*a* shown along line B-B' in FIG. 1E, in accordance with some embodiments. FIGS. 2A-3 to 2O-3 illustrate cross-sectional representations of various stages of manufacturing the semiconductor structure 100*a* shown along line B-B' in FIG. 1E, in accordance with some embodiments.

More specifically, FIG. 2A-1 illustrates the cross-sectional representation shown along line A-A'' in FIG. 1E and FIG. 2A-2 illustrates the cross-sectional representation shown along line B-B' in FIG. 1E in accordance with some embodiments.

As shown in FIGS. 2B-1, 2B-2 and 2B-3, after the gate spacers 126 and the fin spacers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 105 are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

Afterwards, as shown in FIGS. 2C-1, 2C-2 and 2C-3, after the source/drain (S/D) recesses 130 are formed, the first semiconductor material layers 106 exposed by the source/drain recesses 130 are laterally recessed to form notches 132, in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIGS. 2D-1, 2D-2 and 2D-3, inner spacers 134 are formed in the notches 132 between the second semiconductor material layers 108, in accordance with some embodiments. The inner spacers 134 are configured to separate the source/drain (S/D) structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 2E-1, 2E-2 and 2E-3, after the inner spacers 134 are formed, a first source/drain (S/D) structure 136*a* and a second S/D structure 136*b* are formed in the S/D recesses 130, in accordance with some embodiments. In some embodiments, the first source/drain (S/D) structure 136*a* and the second S/D structure 136*b* are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the first source/drain (S/D) structure 136*a* and the second S/D structure 136*b* are made of any applicable material, such as Ge, Si, GaAs, AlGaAs, SiGe, GaAsP, SiP, SiC, SiCP, or a combination thereof.

In some embodiments, the first source/drain (S/D) structure 136*a* and the second S/D structure 136*b* are in-situ doped during the epitaxial growth process. For example, the first source/drain (S/D) structure 136*a* and the second S/D structure 136*b* may be the epitaxially grown SiGe doped with boron (B). For example, the first source/drain (S/D) structure 136*a* and the second S/D structure 136*b* may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP)

source/drain features. In some embodiments, the first source/drain (S/D) structure 136*a* and the second S/D structure 136*b* are doped in one or more implantation processes after the epitaxial growth process.

Next, as shown in FIGS. 2F-1, 2F-2 and 2F-3, after the first source/drain (S/D) structure 136*a* and the second S/D structure 136*b* are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 2F-3 in accordance with some embodiments.

Afterwards, as shown in FIGS. 2G-1, 2G-2 and 2G-3, the dummy gate structure 118 is removed to form a trench 141, in accordance with some embodiments. As a result, the first stack structure 104*a* and the second stack structure 104*b* are exposed by the trench 141.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 2H-1, 2H-2 and 2H-3, the first semiconductor material layers 106 are removed to form nanostructures 108' with the second semiconductor material layers 108, in accordance with some embodiments. The first S/D structure 132*a* and the second S/D structure 132*b* are attached to the nanostructures 108'. The first stack structure 104*a* and the second stack structure 104*b* includes the nanostructures 108'.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, as shown in FIGS. 2I-1, 2I-2 and 2I-3, after the nanostructures 108' are formed, a first gate structure 142*a* and a second gate structure 142*b* are formed to surround the nanostructures 108' and over the isolation structure 110, in accordance with some embodiments. More specifically, the dummy gate structures 118 and the first semiconductor material layers 106 are removed to form nanostructures 108' with the second semiconductor material layers 108, in accordance with some embodiments. The S/D structure 136 is attached to the nanostructures 108'.

After the nanostructures 108' are formed, the first gate structure 142*a* and the second gate structure 142*b* are formed wrapped around the nanostructures 108'. The first gate structure 142*a* and the second gate structure 142*b* wrap around the nanostructures 108' to form gate-all-around transistor structures in accordance with some embodiments. In some embodiments, the first gate structure 142*a* includes an interfacial layer 144, a gate dielectric layer 146, and a first gate electrode layer 148*a*. In some embodiments, the second gate structure 142*b* includes an interfacial layer 144, a gate dielectric layer 146, and a second gate electrode layer 148*b*.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the first gate structure 142*a* and the second gate structure 142*b* are formed on the gate dielectric layer 146. In some embodiments, the first gate structure 142*a* and the second gate structure 142*b* are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate structure 142*a* and the second gate structure 142*b* are formed using chemical vapor deposition (CVD), atomic layer deposition (ALD), electroplating, another applicable method, or a combination thereof. Other conductive layers, such as work function metal layers, may also be formed in the first gate structure 142*a* and the second gate structure 142*b*, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and first gate structure 142*a* and the second gate structure 142*b* are formed, a planarization process such as CMP or an etch-back process may be performed until the ILD layer 140 is exposed.

Afterwards, as shown in FIGS. 2J-1, 2J-2 and 2J-3, an etch stop layer 150 is formed over the gate structure 142, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, as shown in FIGS. 2K-1, 2K-2 and 2K-3, a silicide layer 154 and an S/D contact structure 156 are formed over the first S/D structure 136*a* and the second S/D structure 136*b*, in accordance with some embodiments.

In some embodiments, the contact openings may be formed through the contact etch stop layer 138, the interlayer dielectric layer 140, the etch stop layer 150 and the dielectric layer 152 to expose the top surfaces of the first S/D structures 136*a* and the second S/D structure 136*b*, and then the silicide layers 154 and the S/D contact structure 156 may be formed in the contact openings. The contact openings may be formed using a photolithography process and an etching process. In addition, some portions of the first S/D structure 136*a* and second S/D structure 136*b* exposed by the contact openings may also be etched during the etching process.

The silicide layers 154 may be formed by forming a metal layer over the top surfaces of the first S/D structure 136*a* and the second S/D structure 136*b* and annealing the metal layer so the metal layer reacts with the first S/D structure 136*a* and the second S/D structure 136*b* to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

Afterwards, as shown in FIGS. 2L-1, 2L-2 and 2L-3, after the S/D contact structure 156 are formed, an etch stop layer 162 is formed over the S/D contact structure 156, and a dielectric layer 164 is formed over the etch stop layer 162, in accordance with some embodiments. Next, an S/D conductive plug 166 is formed over the S/D contact structure 156, and a gate conductive plug 168 is formed over the first gate structure 142*a* and the second gate structure 142*b*. A front end structure 170 is constructed by the etch stop layer 150, the dielectric layer 152, the S/D contact structure 156, the etch stop layer 162, the dielectric layer 164, the S/D conductive plug 166 and the gate conductive plug 168.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing chemical vapor deposition (CVD), atomic layer deposition (ALD), other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

In some embodiments, the S/D conductive plug 166 is made of conductive material, such as tungsten (W), ruthenium (Ru), molybdenum (Mo), or the like. In some embodiments, the S/D conductive plug 166 is formed by performing a deposition process, such as chemical vapor deposition (CVD), physical vapor deposition, (PVD), atomic layer deposition (ALD), or other applicable processes.

In some embodiments, the gate conductive plug 168 is made of conductive material, such as tungsten (W), ruthenium (Ru), molybdenum (Mo), or the like. In some embodiments, the gate conductive plug 168 is formed by performing a deposition process, such as chemical vapor deposition (CVD), physical vapor deposition, (PVD), atomic layer deposition (ALD), or other applicable processes.

Next, as shown in FIGS. 2M-1, 2M-2 and 2M-3, after the front end structure 170 is formed, a carrier substrate (not shown) is attached to the front end structure 170, and then the substrate 102 is turned upside down, and a planarization is performed on the back side of the substrate 102, in accordance with some embodiments. More specifically, a planarization is performed on the substrate 102 until the isolation structure 116 is exposed. The planarization process may be an etching process, a CMP process, a mechanical grinding process, a dry polishing process, or a combination thereof.

For example, the front side surface of the first S/D structure 136*a* is referred to the surface in contact with the first S/D contact structure 136*a*, and the back side surface of the first S/D structures 136*b* is referred to the surface in contact with the substrate 102.

Afterwards, as shown in FIGS. 2N-1, 2N-2 and 2N-3, after a portion of the substrate 102 is removed, and a dielectric layer 174 is formed over the isolation structure 116, in accordance with some embodiments.

The dielectric layer 174 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 174 may be formed by chemical vapor deposition (CVD), physical vapor deposition, (PVD), atomic layer deposition (ALD), or other applicable processes.

Next, as shown in FIGS. 2O-1, 2O-2 and 2O-3, a backside contact structure 178 is formed through the isolation structure 116 and the dielectric layer 174, in accordance with some embodiments. A trench is formed through the dielectric layer 174 and the isolation structure 116, and a conductive material is formed in the trench to form back-side contact structure 178.

The back-side contact structure 178 is in direct contact with the S/D contact structure 156. The back-side contact structure 178 is physically and electrically connected to the S/D contact structure 156. The back-side contact structure 178 penetrates through the etching stop layer 150.

The back-side contact structure 178 has an extending portion lower than the top surface of the S/D structure 136*a*. The extending portion of the back-side contact structure 178 has a bottom surface lower than the top surface of the topmost nanostructure 108'. The bottommost surface of the S/D contact structure 156 is in direct contact with the topmost surface of the back-side contact structure 178.

The back-side contact structure 178 is used to connect to a power rail. The S/D conductive plug 166 is used to transfer a signal, and the gate conductive plug 168 is used to transfer a signal.

The back-side contact structure 178 may include a barrier layer and a conductive layer. In some other embodiments, the back-side contact structure 178 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

As shown in FIG. 2O-2, there is a first height $H_1$ between the top surface of the topmost nanostructure of the nanostructures 108' and the top surface of the isolation structure 116. There is a second height $H_2$ between the top surface of the extending portion of the S/D contact structure 156 and the bottom surface of the extending portion of the S/D contact structure 156. In some embodiments, a ratio of the second height $H_2$ to the first height $H_1$ is in a range from about 0.5 to about 3.

The back-side contact structure 178 has a top surface and a bottom surface, and the top surface has a first width $W_1$, the bottom surface has a second width $W_2$. The second width $W_2$ is greater than the first width $W_1$. In some embodiments, a ratio of the second width $W_2$ to the first width $W_1$ is in a range from about 1.05 to about 2.

It should be noted that since the back-side contact structure 178 is in direct contact with the S/D contact structure 156 and no other layer is between them, the contact resistance between back-side contact structure 178 and the S/D contact structure 156 is low. Therefore, the performance of the semiconductor structure 100*a* is improved.

In some embodiments, when the S/D contact structure 156 and the back-side contact structure 178 are made of the same conductive material, the S/D contact structure 156 and the back-side contact structure 178 are free of barrier layer, and no barrier layer is between them. Therefore, the resistance between the back-side contact structure 178 and the S/D contact structure 156 is further reduced.

FIG. 2O'-1 illustrates a cross-sectional view of a semiconductor structure 100*b*, in accordance with some embodiments. The semiconductor structure 100*b* of FIG. 2O'-1 includes elements that are similar to, or the same as, elements of the semiconductor structure 100*a* of FIG. 2O-1, the difference between the FIG. 2O'-1 and FIG. 2O-1 is the S/D contact structure 156 penetrates through the etch stop layer 150, and the bottom surface of the S/D contact structure 156 is lower than the bottom surface of the etch stop layer 150. Furthermore, the bottom surface of the S/D contact structure 156 is lower than the bottom surface of the bottommost nanostructure 108'.

FIG. 3 illustrates a top view of the semiconductor structure 100*a*, in accordance with some embodiments. FIGS. 2O-1 illustrates a cross-sectional representation of the semiconductor structure 100*a* shown along line $Y_1$-$Y_1$' in FIG. 3, in accordance with some embodiments. FIGS. 2O-2 illustrates a cross-sectional representation of the semiconductor structure 100*a* shown along line $Y_2$-$Y_2$' in FIG. 3, in accordance with some embodiments. FIGS. 2O-3 illustrates a cross-sectional representation of the semiconductor structure 100*a* shown along line X-X' in FIG. 3, in accordance with some embodiments.

As shown in FIG. 3, the first fin structure 104*a* and the second fin structure 104*b* are parallel to each other, and the first gate structure 142*a* and the second gate structure 142*b* are formed over the first fin structure 104*a* and the second fin structure 104*b*. The S/D contact structures 156 are formed on opposite sides of the first gate structure 142*a*, and the S/D conductive plug 166 is formed over the S/D contact structure 156. In addition, the back-side contact structure 178 is formed below the S/D contact structures 156. The back-side contact structure 178 is directly below and electrically connected to the S/D contact structure 156.

Figure 4A:
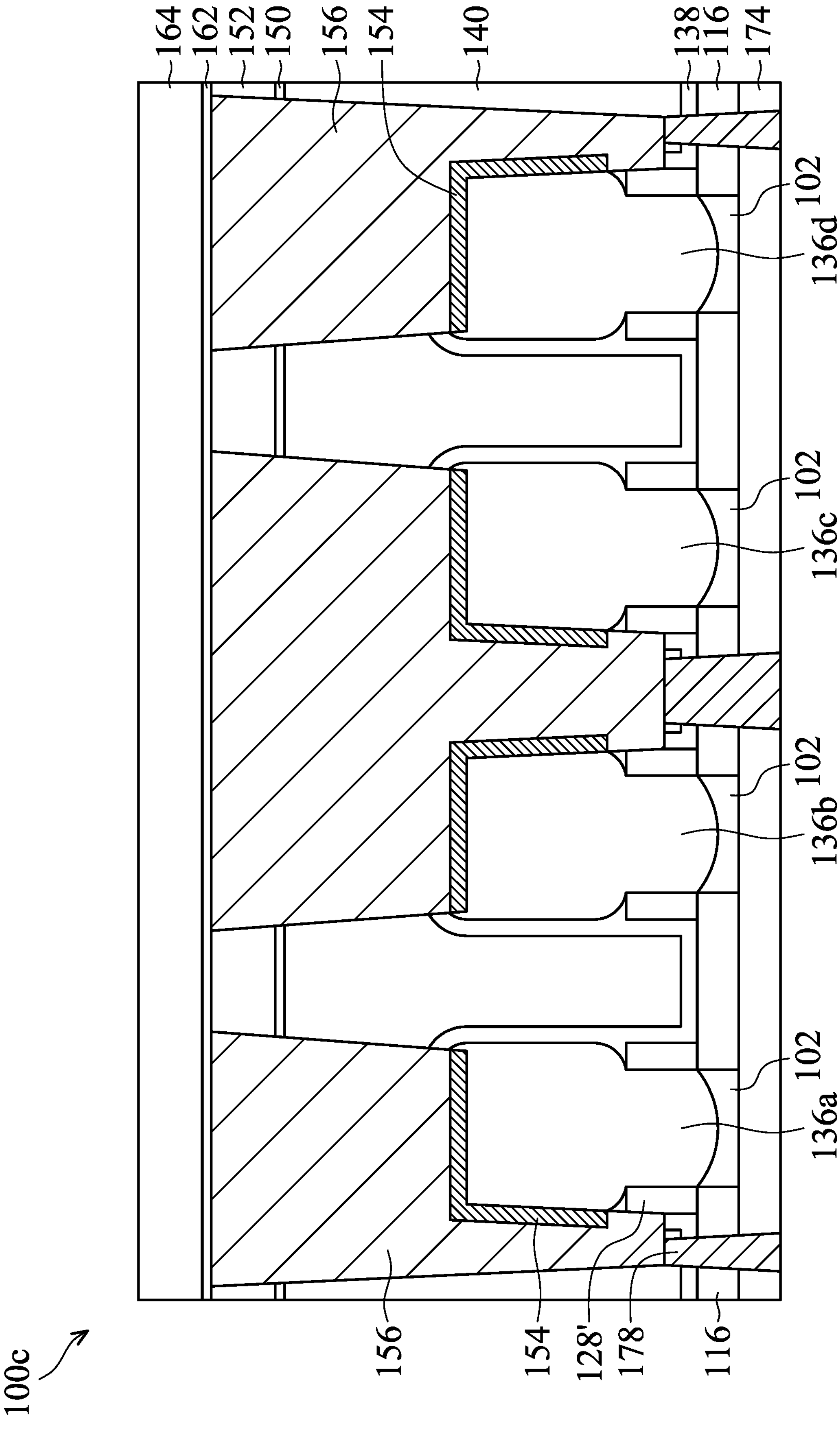
FIG. 4A illustrates a cross-sectional view of a semiconductor structure, in accordance with some embodiments.
Figure 4B:
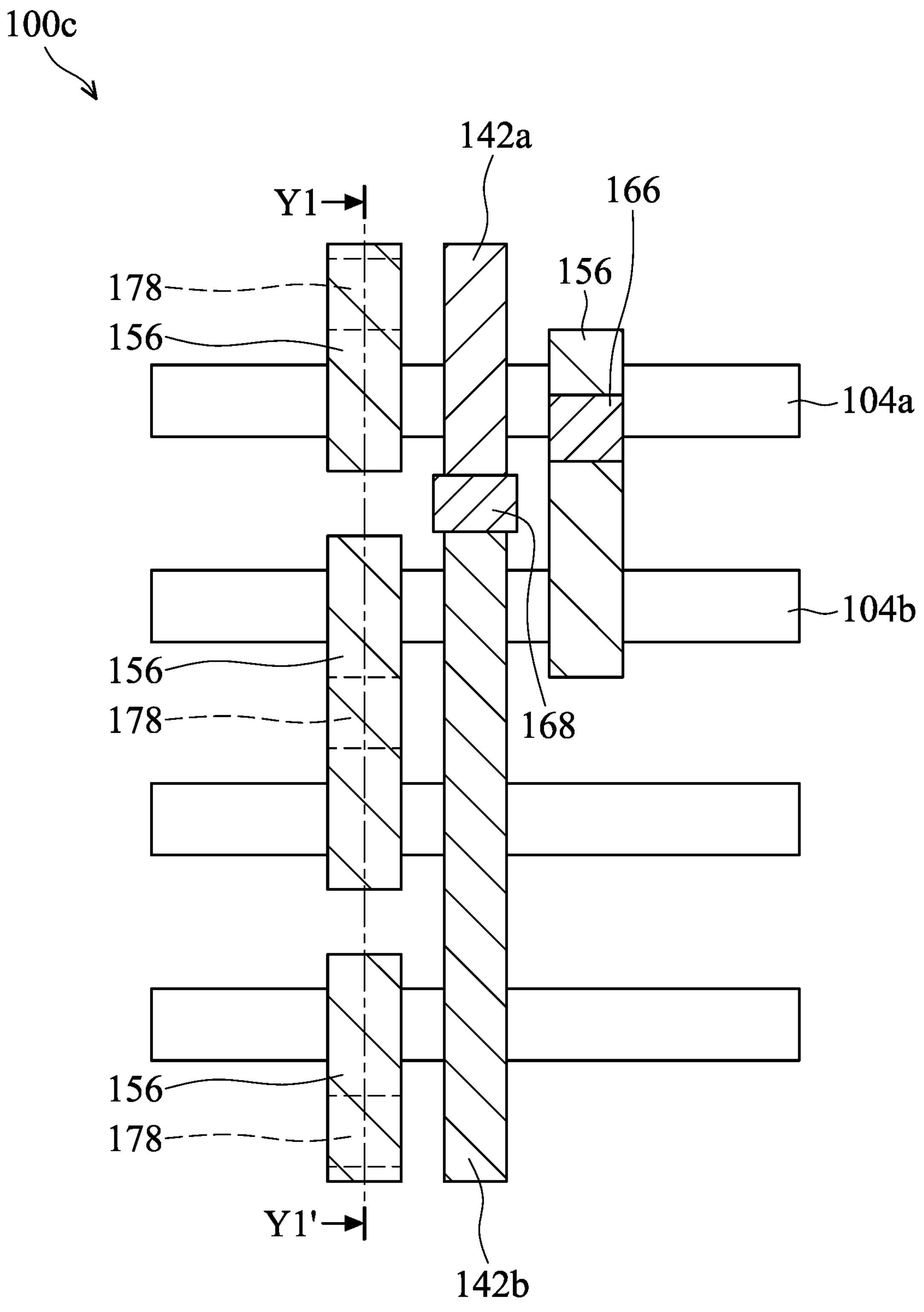
FIG. 4B illustrates a top view of the semiconductor structure, in accordance with some embodiments.

FIG. 4A illustrate a cross-sectional view a semiconductor structure 100*c*, in accordance with some embodiments. FIG. 4B illustrates a top view of the semiconductor structure 100*c*, in accordance with some embodiments. FIG. 4A illustrates a cross-sectional representation of the semiconductor structure 100*c* shown along line $Y_1$-$Y_1$' in FIG. 4B, in accordance with some embodiments.

The semiconductor structure 100*c* of FIG. 4A includes elements that are similar to, or the same as, elements of the semiconductor structure 100*a* of FIG. 2O-1, the difference between the FIG. 4A and FIG. 2O-1 is that the S/D contact structures 156 extends from the second S/D structure 136*b* to the third S/D structure 136*c*, and the S/D contact structures 156 has a T-shaped structure. The S/D contact structures 156 contacts more than one S/D structure. The second S/D structure 136*b* is electrically connected to the third S/D structure 136*c* by the T-shaped first contact structure 156.

Figure 5A:
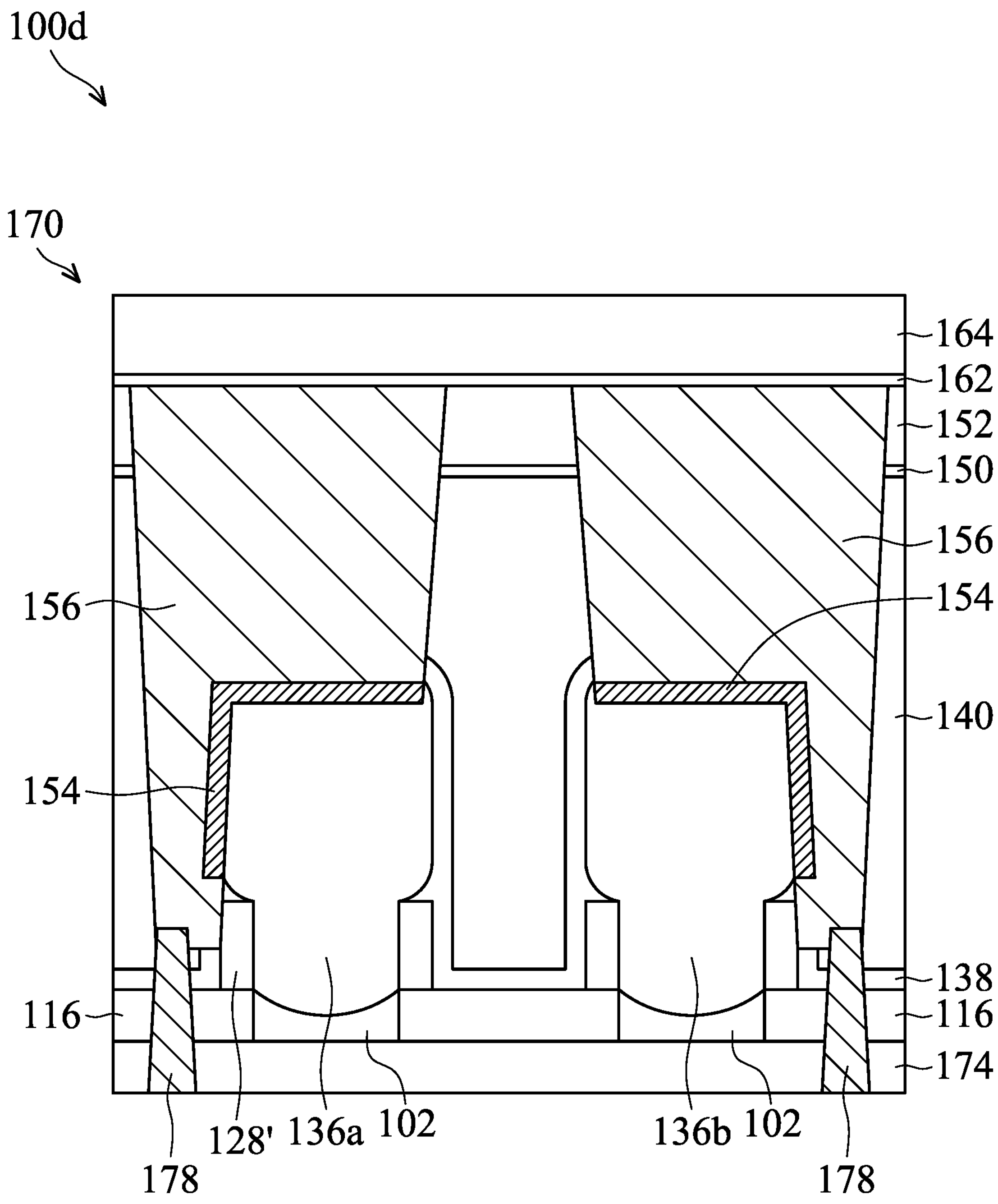
FIG. 5A illustrates a cross-sectional view of a semiconductor structure, in accordance with some embodiments.
Figure 5B:
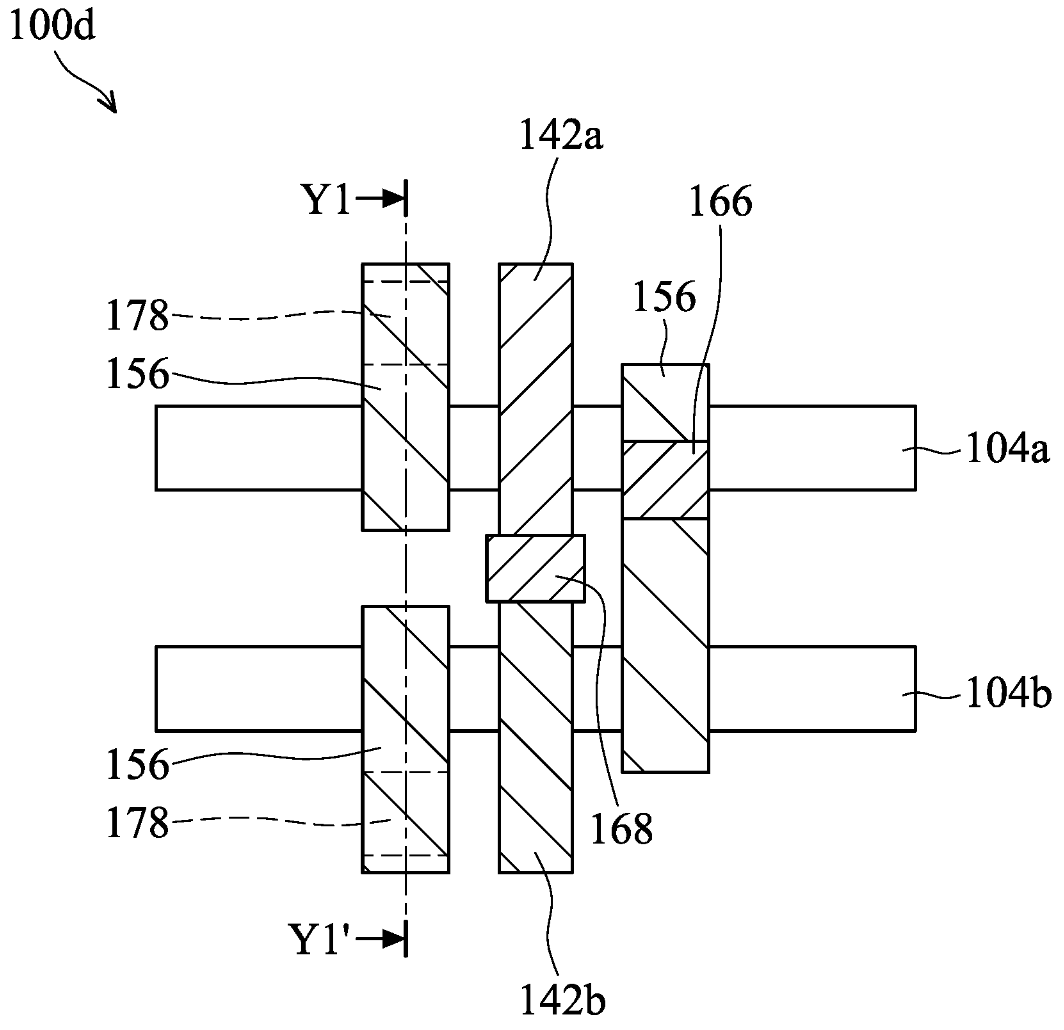
FIG. 5B illustrates a top view of the semiconductor structure, in accordance with some embodiments.

FIG. 5A illustrates a cross-sectional views of a semiconductor structure 100*d*, in accordance with some embodiments. FIG. 5B illustrates a top view of the semiconductor structure 100*d*, in accordance with some embodiments. FIG. 5A illustrates a cross-sectional representation of the semiconductor structure 100*d* shown along line $Y_1$-$Y_1$' in FIG. 5B, in accordance with some embodiments.

The semiconductor structure 100*d* of FIG. 5A includes elements that are similar to, or the same as, elements of the semiconductor structure 100*a* of FIG. 2O-1, the difference between the FIG. 5A and FIG. 2O-1 is that the sidewall and the top surface of the back-side contact structure 178 are in direct contact with the S/D contact structure 156. In addition, the bottommost surface of the S/D contact structure 156 is lower than topmost surface of the back-side contact structure 178.

Figure 6A:
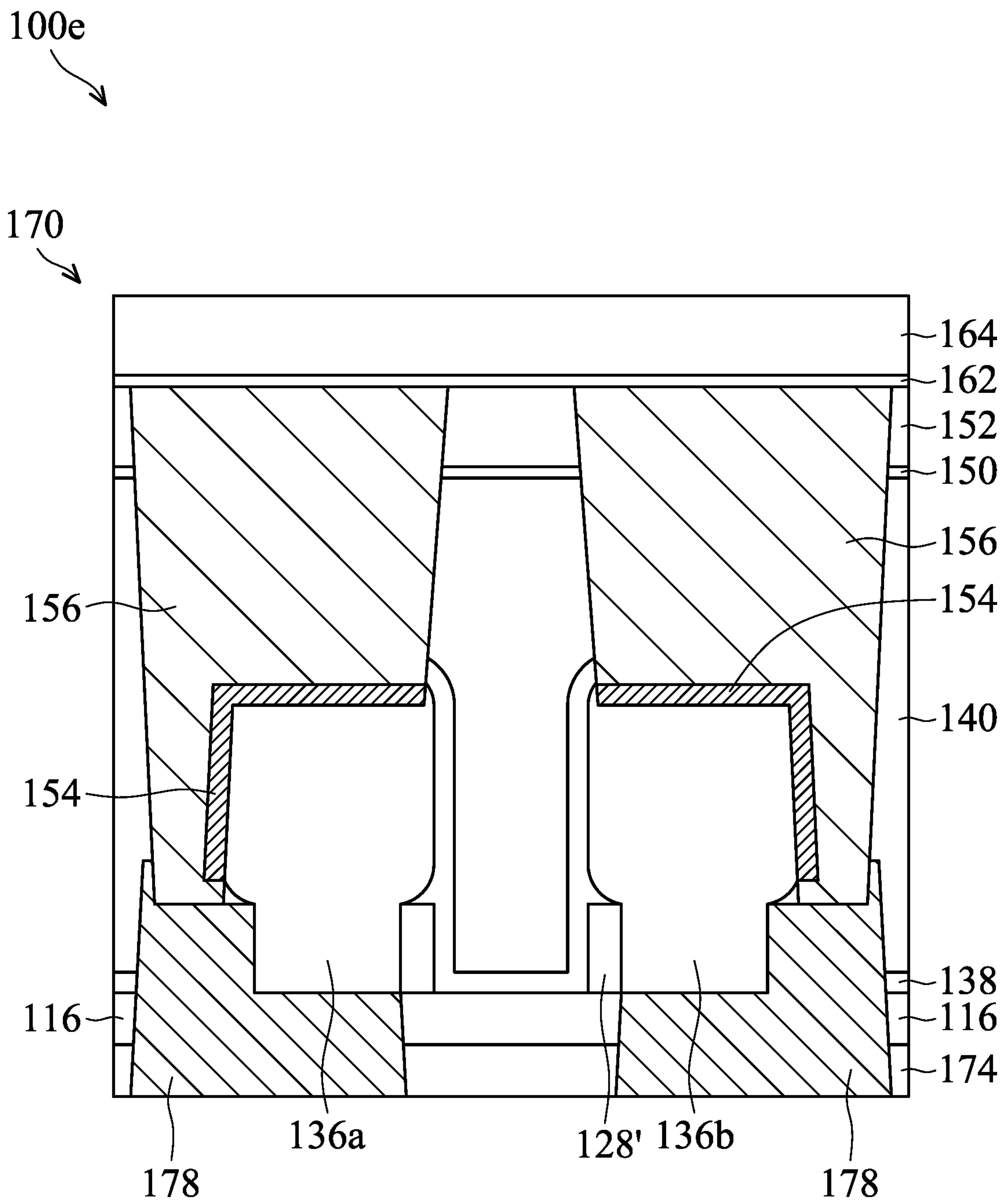
FIG. 6A illustrates a cross-sectional view of a semiconductor structure, in accordance with some embodiments.
Figure 6B:
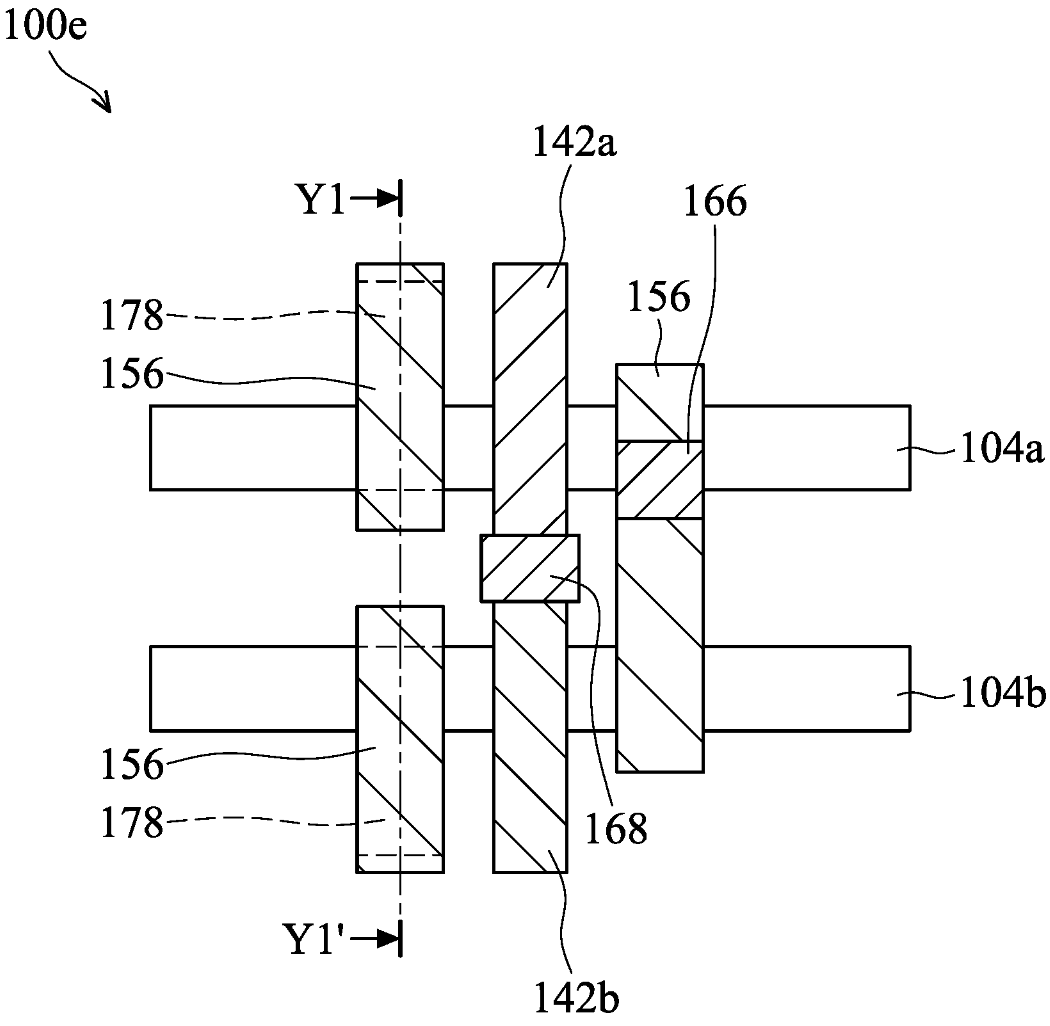
FIG. 6B illustrates a top view of the semiconductor structure, in accordance with some embodiments.

FIG. 6A illustrates a cross-sectional view of a semiconductor structure 100*e*, in accordance with some embodiments. FIG. 6B illustrates a top view of the semiconductor structure 100*e*, in accordance with some embodiments. FIG. 6A illustrates a cross-sectional representation of the semiconductor structure 100*e* shown along line $Y_1$-$Y_1$' in FIG. 6B, in accordance with some embodiments.

The semiconductor structure 100*e* of FIG. 6A includes elements that are similar to, or the same as, elements of the semiconductor structure 100*a* of FIG. 2O-1, the difference between the FIG. 6A and FIG. 2O-1 is that the back-side contact structure 178 in direct contact with the bottom surface of the first S/D structure 136*a* and the bottom surface of the second S/D structure 136*b*. More specifically, the back-side contact structure 178 has a first portion in direct contact with the S/D contact structure 156 and a second portion in direct contact with the first S/D structure 136*a* and the second S/D structure 136*b*.

In some embodiments, a trench is formed through the dielectric layer 174 and the isolation structure 116 to expose the bottom surface of the first S/D structure 136*a*, and then a conductive material is formed in the trench to form the back-side contact structure 178.

Figure 7:
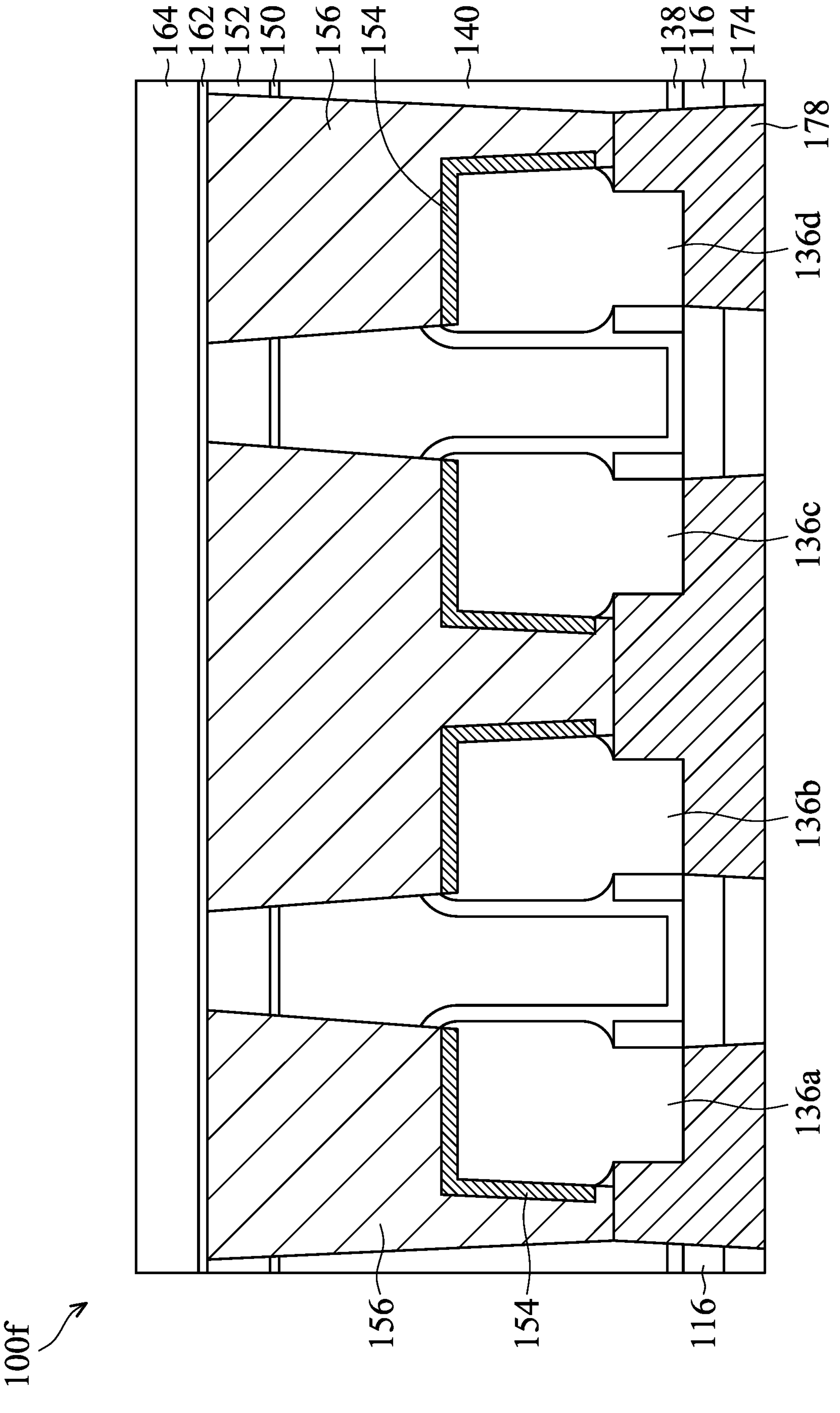
FIG. 7 illustrates a cross-sectional view of a semiconductor structure, in accordance with some embodiments.

FIG. 7 illustrates a cross-sectional view of a semiconductor structure 100*f*, in accordance with some embodiments. The semiconductor structure 100*f* of FIG. 7 includes elements that are similar to, or the same as, elements of the semiconductor structure 100*a* of FIG. 2O-1, the difference between the FIG. 7 and FIG. 2O-1 is that the S/D contact structures 156 extends from the second S/D structure 136*b* to the third S/D structure 136*c*, and the S/D contact structures 156 has a T-shaped structure. In addition, the back-side contact structure 178 in direct contact with the bottom surface of the second S/D structure 136*b* and the bottom surface of the third S/D structure 136*c*.

Figure 8A:
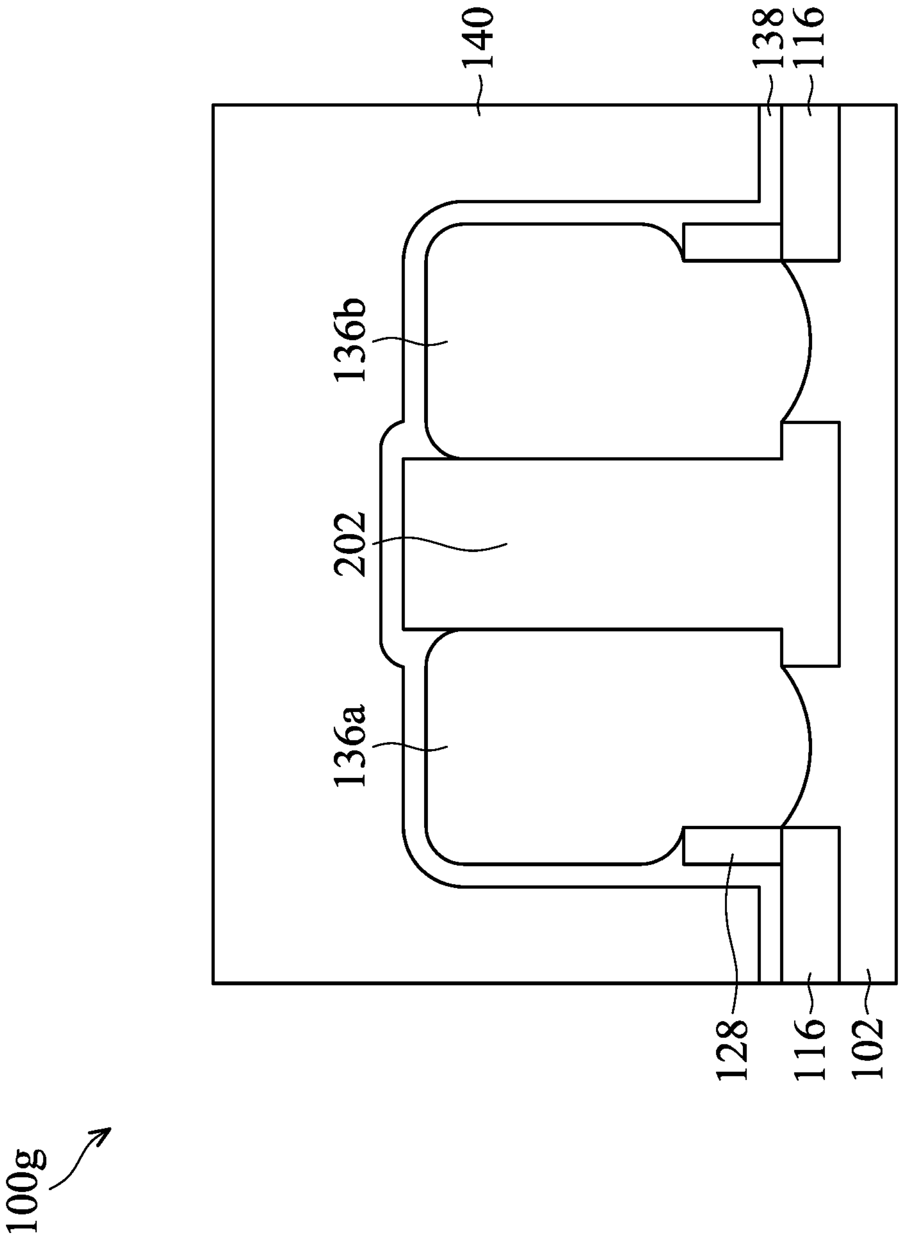
FIGS. 8A to 8C illustrate cross-sectional representations of various stages of manufacturing a semiconductor structure, in accordance with some embodiments.
Figure 8B:
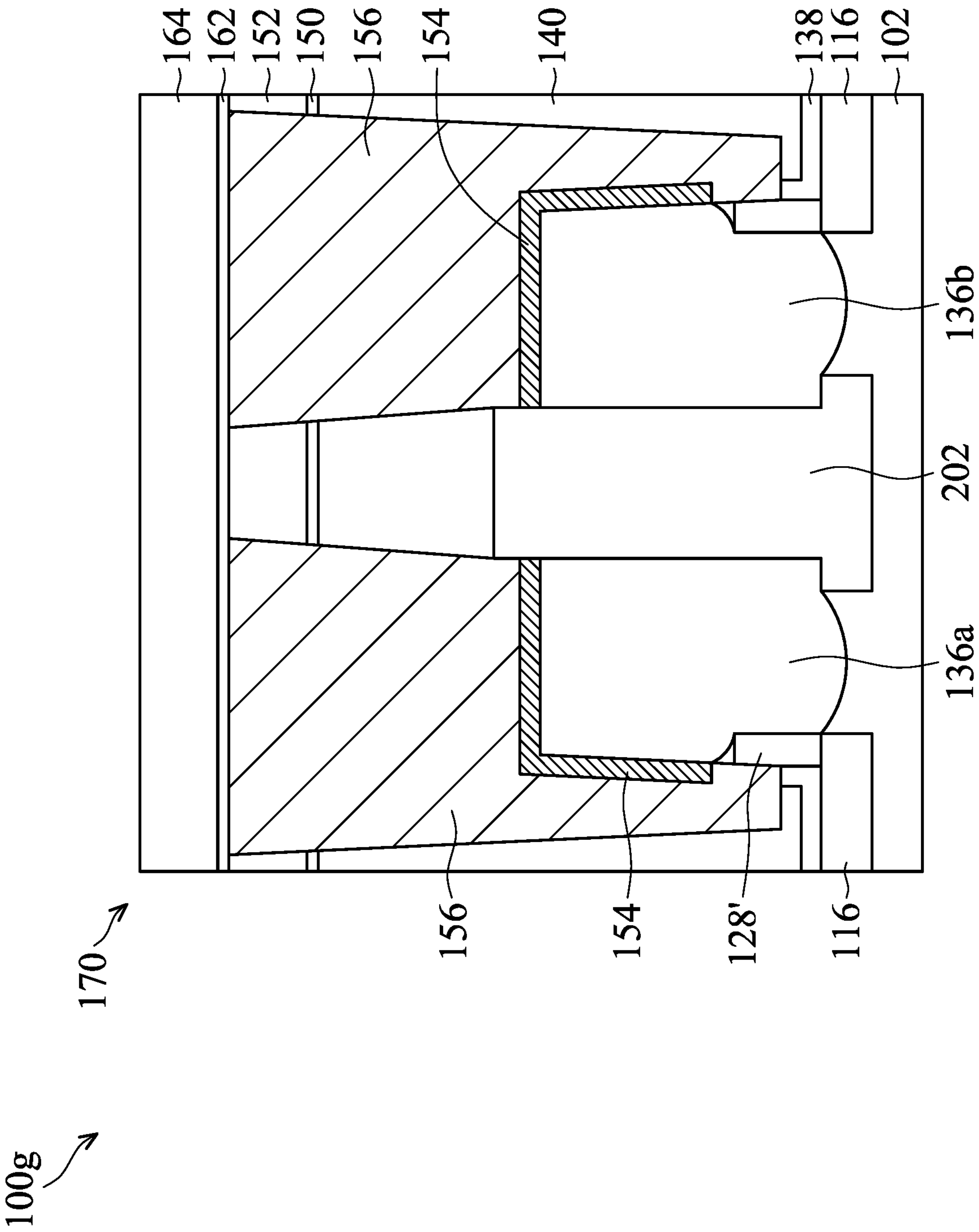
Figure 8C:
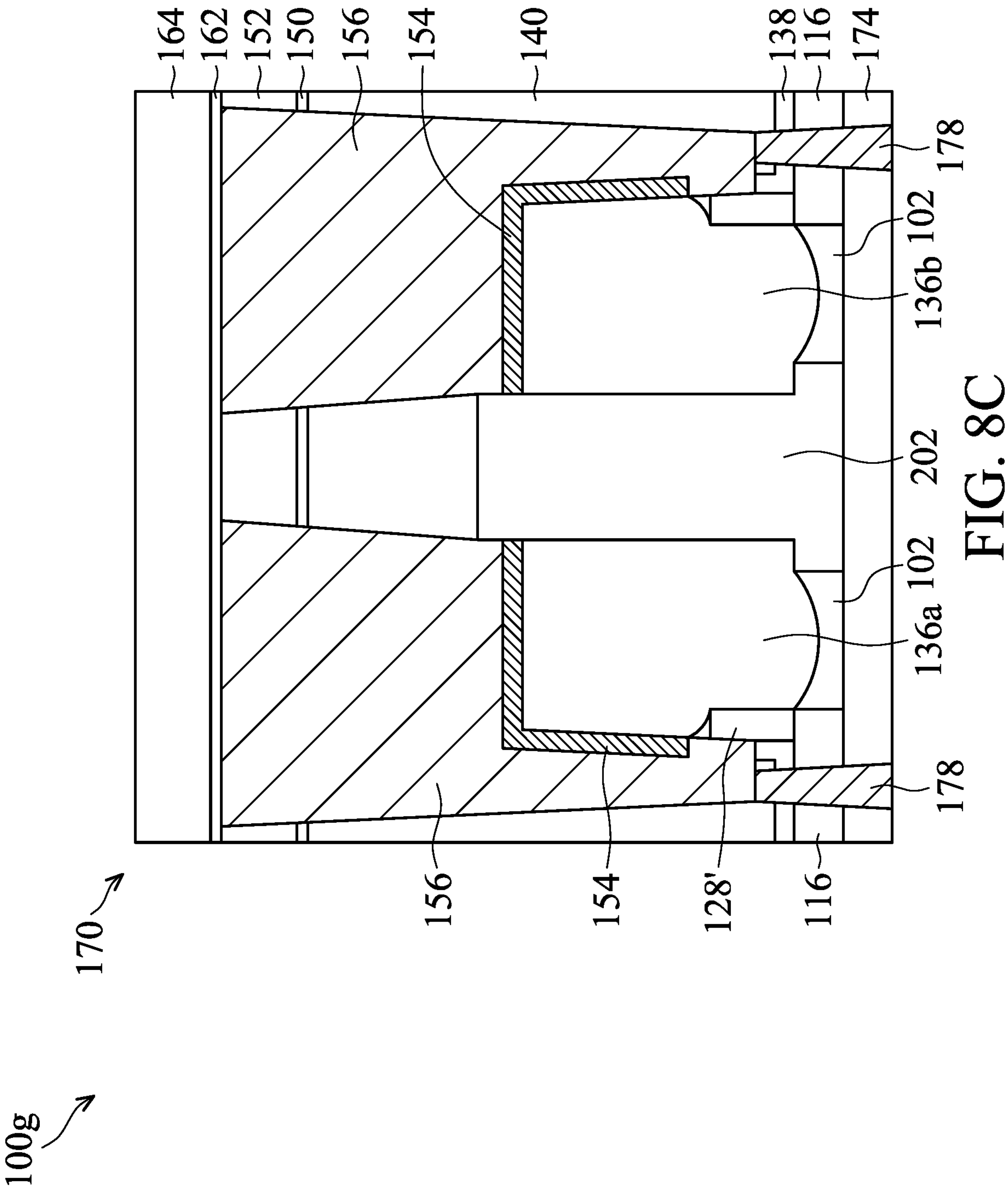

FIGS. 8A to 8C illustrate cross-sectional representations of various stages of manufacturing a semiconductor structure 100*g*, in accordance with some embodiments. The semiconductor structure 100*g* of FIG. 8A-8C includes elements that are similar to, or the same as, elements of the semiconductor structure 100*a* of FIGS. 2A-1-2O-1, 2A-2-2O-2 and 2A-3-2O-3.

As shown in FIG. 8A, a dielectric wall 202 is between and in direct contact with the first S/D structure 136*a* and the second S/D structure 136*b*. The dielectric wall 202 may be formed before or after the step of formation of the isolation structure 116. The dielectric wall 202 is formed between two stacks of the nanostructures 108'. The top surface of the dielectric wall 202 is higher than the top surface of the first S/D structure 136*a* and the top surface of the second S/D structure 136*b*. The bottom surface of the S/D contact structure 156 is lower than the top surface of the dielectric wall 202.

In some embodiments, the dielectric wall 202 is made of SiN, SiCN, SiOC, SiOCN or applicable material. In some embodiments, the dielectric wall 202 is formed by chemical vapor deposition (CVD), atomic vapor deposition (ALD), physical vapor deposition (PVD), another suitable method, or a combination thereof.

Afterwards, as shown in FIG. 8B, the silicide layer 154 and the S/D contact structure 156 are formed over the first S/D structure 136*a* and the second S/D structure 136*b*, in accordance with some embodiments.

Next, as shown in FIG. 8C, the back-side contact structure 178 is formed through the isolation structure 116 and the dielectric layer 174. The back-side contact structure 178 is in direct contact with the S/D contact structure 156. The back-side contact structure 178 is physically and electrically connected to the S/D contact structure 156. The back-side contact structure 178 penetrates through the etching stop layer 150.

Figure 9:
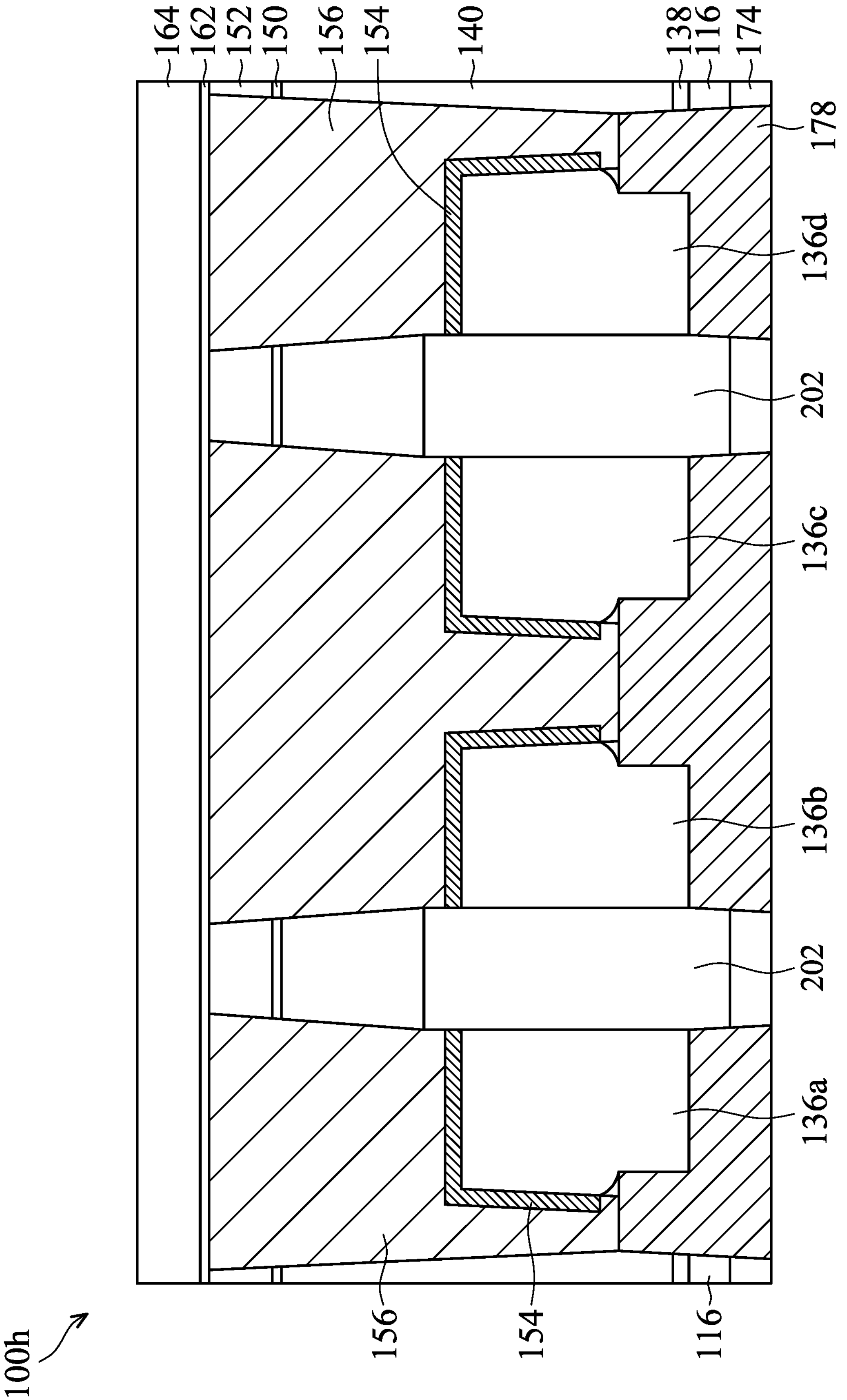
FIG. 9 illustrates a cross-sectional view of a semiconductor structure, in accordance with some embodiments.

FIG. 9 illustrates a cross-sectional view of a semiconductor structure 100*h*, in accordance with some embodiments. The semiconductor structure 100*h* of FIG. 9 includes elements that are similar to, or the same as, elements of the semiconductor structure 100*f* of FIG. 7, the difference between the FIG. 9 and FIG. 7 is that dielectric wall 202 is between the first S/D structure 136*a* and the second S/D structure 136*b*. Another dielectric wall 202 is between the third S/D structure 136*c* and the fourth S/D structure 136*d*.

Each of the semiconductor structures 100*a* to 100*h* has S/D contact structure 156 with the extending portion over the first sides of the first S/D structure 136*a* and the first side of the second S/D structure 136*b*. The extending portion of the S/D contact structure 156 is lower than the top surface of the first S/D structure 136*a* and the top surface of the second S/D structure 136*b*. The extending portion of the S/D contact structure 156 is also lower than the top surface of the topmost nanostructure 108'. The back-side contact structure 178 over the second side of the first S/D structure 136*a* and the second side of the second S/D structure 136*b*. The back-side contact structure 178 is in direct contact with the S/D contact structure 156, and on other layer is between the back-side contact structure 178 and the S/D contact structure 156. The contact resistance between the first contact structure and the second contact structure is reduced. Therefore, the performance of the semiconductor structure is improved.

In some embodiments, the back-side contact structure 178 is in direct contact with the bottom surface of the first S/D structure 136*a* and the bottom surface of the second S/D structure 136*b*. In some embodiments, the back-side contact structure 178 has a reversed T-shaped structure. In some embodiments, the S/D contact structure 156 is in direct contact with the top surface and the sidewall surface of the back-side contact structure 178. In some embodiments, the S/D contact structure 156 has a T-shaped structure.

It should be appreciated that the semiconductor structures 100*a* to 100*h* having the S/D contact structure 156 with the extending portion in direct contact with the back-side contact structure 178 described above may also be applied to FinFET structures, although not shown in the figures.

It should be noted that same elements in FIGS. 1A to 9 may be designated by the same numerals and may include similar or the same materials and may be formed by similar or the same processes; therefore such redundant details are omitted in the interest of brevity. In addition, although FIGS. 1A to 9 are described in relation to the method, it will be appreciated that the structures disclosed in FIGS. 1A to 9 are not limited to the method but may stand alone as structures independent of the method. Similarly, although the methods shown in FIGS. 1A to 9 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes a gate structure formed over the nanostructures and an S/D structure adjacent to the gate structure. The first contact structure formed over a first side (top side) of the S/D structure, and a second contact structure formed over a second side (bottom side) of the S/D structure. The first contact structure has an extending portion which is lower than the top surface of the S/D structure. In addition, the extending portion which is lower than the top surface of the topmost nanostructure. The extending portion of the first contact structure is physically and electrically connected to the second contact structure. Since the first contact structure is in direct contact with the second contact structure, no other layers are between them. The contact resistance between the first contact structure and the second contact structure is reduced. Therefore, the performance of the semiconductor structure is improved.

In some embodiments, a semiconductor structure is provided. The semiconductor structure includes a gate structure formed over a substrate, and a first source/drain (S/D) structure formed adjacent to the gate structure. The semiconductor structure includes a first contact structure formed over a first side of the first S/D structure, and a portion of the first contact structure is lower than a top surface of the first S/D structure. The semiconductor structure includes a second contact structure formed over a second side of the first S/D structure, and the second contact structure is in direct contact with the first contact structure.

In some embodiments, a semiconductor structure is provided. The semiconductor structure includes a first stack structure formed over a substrate, and the first stack structure includes a plurality of nanostructures. The semiconductor structure includes a gate structure formed over the first stack structure, and a first source/drain (S/D) structure formed adjacent to the gate structure. The semiconductor structure also includes a first contact structure formed over a first side of the first S/D structure, and the first contact structure has an extending portion, and the extending portion has a bottom surface lower than a top surface of a topmost nanostructure. The semiconductor structure further includes a second contact structure formed over a second side of the first S/D structure, and the second contact structure is electrically connected to the first contact structure by the extending portion.

In some embodiments, a method for forming a semiconductor structure is provided. The method includes forming a first fin structure protruding from a front side of a substrate, and the first fin structure includes first semiconductor material layers and second semiconductor material layers alternately stacked. The method also includes forming an isolation structure surrounding the first fin structure, and removing a portion of the first fin structure to form an S/D recess. The method further includes forming an S/D structure in the S/D recess, and forming a first contact structure over a first side of the S/D structure. The first contact structure has an extending portion, and the extending portion has a bottom surface that is lower than a top surface of the S/D structure. The method includes forming a second contact structure over a second side of the S/D structure, and the second contact structure is in direct contact with the first contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first fin structure protruding from a front side of a substrate, wherein the first fin structure comprises first semiconductor material layers and second semiconductor material layers alternately stacked;

forming an isolation structure surrounding the first fin structure;

removing a portion of the first fin structure to form a S/D recess;

forming an S/D structure in the S/D recess;

forming a first contact structure over a first side of the S/D structure, wherein the first contact structure has an extending portion, and the extending portion has a bottom surface lower than a top surface of the S/D structure; and forming a second contact structure over a second side of the S/D structure after forming the first contact structure, wherein the second contact structure interfaces with the first contact structure.

2. The method for forming the semiconductor structure as claimed in claim 1, further comprising:

removing a portion of the substrate to expose the isolation structure;

forming a dielectric layer on the isolation structure;

forming a trench through the dielectric layer and the isolation structure; and forming the second contact structure in the trench.

3. The method for forming the semiconductor structure as claimed in claim 2, wherein a bottom surface of the S/D structure is exposed by the trench, and the second contact structure is in direct contact with a bottom surface of the S/D structure after forming the second contact structure in the trench.

4. The method for forming the semiconductor structure as claimed in claim 1, further comprising:

forming a dielectric wall adjacent to the S/D structure, wherein a top surface of the dielectric wall is higher than a top surface of the S/D structure, and a bottom surface of the first contact structure is lower than the top surface of the dielectric wall.

5. The method for forming the semiconductor structure as claimed in claim 1, further comprising:

forming a dummy gate structure over the first fin structure;

removing the first semiconductor material layers to form a plurality of nanostructures; and replacing the dummy gate structure with a gate structure, wherein the nanostructures are wrapped by the gate structure.

6. The method for forming the semiconductor structure as claimed in claim 1, further comprising:

forming a fin spacer adjacent to the S/D structure, wherein the bottom surface of the extending portion of the first contact structure is lower than a top surface of the fin spacer.

7. The method for forming the semiconductor structure as claimed in claim 1, further comprising:

forming a silicide layer on the S/D structure, wherein a bottommost surface of the silicide layer is lower than a top surface of the S/D structure.

8. The method for forming the semiconductor structure as claimed in claim 1, wherein the first contact structure has a T-shaped structure.

9. The method for forming the semiconductor structure as claimed in claim 1, wherein a portion of the second contact structure is embedded in the first contact structure.

10. A method for forming a semiconductor structure, comprising:

forming a first fin structure protruding from a front side of a substrate, wherein the first fin structure comprises first semiconductor material layers and second semiconductor material layers alternately stacked;

forming an isolation structure surrounding the first fin structure;

forming a dummy gate structure on the first fin structure;

forming a gate spacer layer adjacent to the dummy gate structure;

forming a fin spacer adjacent to the first fin structure;

removing a portion of the first fin structure to form a S/D recess;

forming an S/D structure in the S/D recess;

forming a first contact structure over a first side of the S/D structure, wherein a bottom surface of the first contact structure is lower than a top surface of the fin spacer;

removing a portion of the substrate from a backside of the substrate;

forming a dielectric layer below the substrate;

forming a trench through the dielectric layer and the isolation structure; and forming a second contact structure in the trench, wherein the second contact structure is through the isolation structure.

11. The method for forming the semiconductor structure as claimed in claim 10, wherein the second contact structure interfaces with the first contact structure.

12. The method for forming the semiconductor structure as claimed in claim 11, wherein a top surface of the second contact structure is higher than a bottom surface of the S/D structure.

13. The method for forming the semiconductor structure as claimed in claim 10, further comprising:

forming a silicide layer on the S/D structure, wherein a bottommost surface of the silicide layer is lower than a top surface of the S/D structure.

14. The method for forming the semiconductor structure as claimed in claim 10, further comprising:

forming a dielectric wall adjacent to the S/D structure, wherein a top surface of the dielectric wall is higher than a top surface of the S/D structure, and a bottom surface of the first contact structure is lower than the top surface of the dielectric wall.

15. A method for forming a semiconductor structure, comprising:

forming a first fin structure and a second fin structure protruding from a front side of a substrate, wherein the first fin structure and the second fin structure, respectively, comprise first semiconductor material layers and second semiconductor material layers alternately stacked;

removing a portion of the first fin structure to form a first S/D recess;

removing a portion of the second fin structure to form a second S/D recess;

forming a first S/D structure in the first S/D recess;

forming a second S/D structure in the second S/D recess;

forming a first contact structure over a frontside of the first S/D structure and a frontside of the second S/D structure, wherein the first contact structure has a T-shaped structure; and forming a second contact structure connecting a backside of the first S/D structure and a backside of the second S/D structure.

16. The method for forming the semiconductor structure as claimed in claim 15, wherein the second contact structure has a reversed T shaped structure.

17. The method for forming the semiconductor structure as claimed in claim 16, wherein an interface between the first contact structure and the second contact structure is lower than a top surface of the first S/D structure.

18. The method for forming the semiconductor structure as claimed in claim 15, further comprising:

forming a fin spacer adjacent to the first S/D structure, wherein a bottom surface of the first contact structure is lower than a top surface of the fin spacer.

19. The method for forming the semiconductor structure as claimed in claim 15, further comprising:

forming a dummy gate structure over the first fin structure;

removing the first semiconductor material layers to form a plurality of nanostructures; and replacing the dummy gate structure with a gate structure, wherein the nanostructures are wrapped by the gate structure.

20. The method for forming the semiconductor structure as claimed in claim 15, further comprising:

forming a dielectric wall adjacent to the first S/D structure, wherein a top surface of the dielectric wall is higher than a top surface of the first S/D structure, and a bottom surface of the first contact structure is lower than the top surface of the dielectric wall.

* * * * *